US012154916B2

(12) United States Patent
Han

(10) Patent No.: US 12,154,916 B2
(45) Date of Patent: Nov. 26, 2024

(54) APPARATUS FOR MANUFACTURING DISPLAY DEVICE AND METHOD OF MANUFACTURING THE DISPLAY DEVICE

(71) Applicant: Samsung Display Co., Ltd., Yongin-si (KR)

(72) Inventor: Jeongwon Han, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 470 days.

(21) Appl. No.: 17/039,020

(22) Filed: Sep. 30, 2020

(65) Prior Publication Data

US 2021/0296375 A1 Sep. 23, 2021

(30) Foreign Application Priority Data

Mar. 18, 2020 (KR) ........................ 10-2020-0033303

(51) Int. Cl.
*H01L 27/12* (2006.01)
*B41J 2/045* (2006.01)
(Continued)

(52) U.S. Cl.
CPC ...... *H01L 27/1292* (2013.01); *B41J 2/04535* (2013.01); *B41J 2/0456* (2013.01);
(Continued)

(58) Field of Classification Search
CPC ...... H10K 71/00; H10K 50/11; H10K 50/844; H10K 59/12; H10K 71/12; H10K 71/135;
(Continued)

(56) References Cited

U.S. PATENT DOCUMENTS 7,204,573 B2 4/2007 Koyama
7,246,878 B2 * 7/2007 Ogawa .............. G05B 19/4099 347/105

(Continued)

FOREIGN PATENT DOCUMENTS

JP 5-149769 6/1993
JP 2005-59386 3/2005

(Continued)

OTHER PUBLICATIONS

JP2006023275 (Year: 2006).*

(Continued)

*Primary Examiner* — Michelle Mandala
*Assistant Examiner* — Kevin Quinto
(74) *Attorney, Agent, or Firm* — KILE PARK REED & HOUTTEMAN PLLC

(57) ABSTRACT

Provided are an apparatus for manufacturing a display device and a method of manufacturing the display device. The apparatus for manufacturing a display device includes a droplet discharge unit including a nozzle that discharges a droplet, at least one sensor that senses a partial shape of an outer surface of the droplet projected onto a plane and a cross-sectional shape of the droplet discharge unit projected onto the plane, the plane being on a falling path of the droplet discharged from the droplet discharge unit, and a controller that calculates, based on a result sensed by the at least one sensor, at least one of a volume of the droplet, a falling speed of the droplet, a discharge angle at which the droplet is discharged from the nozzle, and a falling path of the droplet moving from the nozzle to a substrate.

11 Claims, 16 Drawing Sheets

140
SF1
DR
PO1
PO2
PO3
150
160
Z
X
Y

(51) Int. Cl.
*H10K 71/00* (2023.01)
*H10K 71/13* (2023.01)

(52) U.S. Cl.
CPC .......... *B41J 2/04561* (2013.01); *H10K 71/00* (2023.02); *H10K 71/135* (2023.02)

(58) Field of Classification Search
CPC .. H10K 71/162; H10K 71/191; B05B 12/004; B05B 12/082; B41J 2/04535; B41J 2/0456; B41J 2/04561; B41J 2/04586; H01L 27/129
See application file for complete search history.

(56) References Cited

U.S. PATENT DOCUMENTS

| | | | | |
|---|---|---|---|---|
| 7,677,689 | B2 | 3/2010 | Kim et al. | |
| 8,020,960 | B2 | 9/2011 | Lee | |
| 8,072,610 | B1 | 12/2011 | Schmit et al. | |
| 8,691,323 | B2 | 4/2014 | Von Drasek et al. | |
| 9,713,240 | B2 | 7/2017 | Riggs et al. | |
| 9,880,377 | B1 | 1/2018 | Safrani et al. | |
| 11,563,202 | B2 * | 1/2023 | Kim | B05B 12/004 |
| 2004/0223013 | A1 * | 11/2004 | Kuwahara | B41J 2/04578 347/9 |
| 2005/0122363 | A1 * | 6/2005 | Koyama | B41J 2/0456 347/19 |
| 2009/0000391 | A1 * | 1/2009 | Dorrmann | B05B 12/082 356/436 |
| 2011/0032293 | A1 * | 2/2011 | Yamamoto | B41J 2/2139 347/10 |
| 2011/0134175 | A1 * | 6/2011 | Hong | B41J 2/04573 347/10 |
| 2014/0184683 | A1 * | 7/2014 | Harjee | H10K 71/191 347/14 |
| 2014/0192110 | A1 * | 7/2014 | Takiguchi | B41J 2/0456 347/19 |
| 2016/0379800 | A1 * | 12/2016 | Ohtsu | H01J 37/32541 216/13 |
| 2017/0015045 | A1 * | 1/2017 | Yamaguchi | B05D 3/12 |
| 2017/0227463 | A1 | 8/2017 | Smith et al. | |
| 2017/0259560 | A1 * | 9/2017 | Sreenivasan | B41J 2/04581 |
| 2017/0304535 | A1 * | 10/2017 | Hirata | A61M 5/16877 |
| 2017/0370709 | A1 | 12/2017 | Mace et al. | |
| 2018/0257099 | A1 | 9/2018 | Miyazaki et al. | |
| 2018/0283856 | A1 * | 10/2018 | Suemasu | G01B 11/00 |
| 2019/0137626 | A1 | 5/2019 | Dietz | |
| 2019/0217545 | A1 | 7/2019 | Eller et al. | |
| 2019/0371684 | A1 | 12/2019 | Vronsky et al. | |
| 2020/0079077 | A1 * | 3/2020 | Cho | B41J 2/04508 |
| 2020/0361204 | A1 * | 11/2020 | Kim | B41J 11/46 |
| 2020/0395543 | A1 * | 12/2020 | Han | H10K 71/00 |
| 2021/0210734 | A1 * | 7/2021 | Kim | H10K 71/162 |
| 2021/0336141 | A1 * | 10/2021 | Han | H10K 71/135 |

FOREIGN PATENT DOCUMENTS

| | | |
|---|---|---|
| JP | 2006-23275 | 1/2006 |
| JP | 2019-525856 | 9/2019 |
| KR | 10-2005-0121937 | 12/2005 |
| KR | 10-0641378 | 11/2006 |
| KR | 10-2008-0099500 | 11/2008 |
| KR | 10-0975647 | 8/2010 |
| KR | 10-2013-0060508 | 6/2013 |
| KR | 10-1396216 | 5/2014 |
| KR | 10-1525800 | 6/2015 |
| KR | 10-2016-0083420 | 7/2016 |
| KR | 10-1701904 | 2/2017 |
| KR | 10-2017-0051466 | 5/2017 |
| KR | 10-1818695 | 1/2018 |
| KR | 10-2018-0038543 | 4/2018 |
| KR | 10-2018-0064582 | 6/2018 |
| KR | 10-2018-0102489 | 9/2018 |
| KR | 10-2019-0000602 | 1/2019 |
| KR | 10-2019-0053098 | 5/2019 |

OTHER PUBLICATIONS

"CHRocodile CLS", Precitec, Jun. 15, 2020, Precitec Group, https://www.precitec.de/en/products/optical-measuring-technology/line-and-multipoint-sensors.
"CHRomatic Confocal Principle for Distance Measurements", Precitec, 2020, Precitec Group.
Juha Saily, "Chromatic Line Confocal Sensor Technology in High-Speed 3D and Deep Depth of Focus 2D Imaging Applications", Microsc. Microanal., 2018, pp. 1142-1143, vol. 24 (Suppl 1).
"Stitch", Share Your Findings, JetXpert, jetxpert.com/add-ons/automation/stitch.
"Diagram of the light path in a confocal microscopy system", Jun. 15, 2020, ResearchGate GmbH, https://www.researchgate.net/figure/Diagram-of-the-light-path-in-a-confocal-microscopy-system-Pinhole-aperture-is-in-front_fig2_299859695.
Jae Sung Park et al., "Optically sliced micro-PIV using confocal laser scanning microscopy (CLSM)", Experiments in Fluids, 2004, pp. 105-119, vol. 37.
"Scanning white light interferometer for 3D surface measurements", Jun. 15, 2020, ResearchGate GmbH, https://www.researchgate.net/figure/Scanning-white-light-interferometer-for-3D-surface-measurements-In-this-paper-all_fig1_252817524.
"Confocal microscopy", Wikipedia, Jun. 15, 2020, https://en.wikipedia.org/wiki/Confocal_microscopy.
"Interferometric microscope", Wikipedia, Jun. 15, 2020, https://en.wikipedia.org/wiki/Interferometric_microscopy.
"Laser Interferometers", Surface Form Metrology, Jun. 15, 2020, zygo, https://www.zygo.com/?/met/interferometers/&gclid=EAIaIQobChMIyfOC_Yq44AIVOqqWCh0xqwXUEAAYASAAEgIWuvD_BwE.
"White Light Interferometry", Nanoscience Instruments, Jun. 15, 2020, https://www.nanoscience.com/techniques/optical-profilometry/white-light-interferometry/.
"Chromatic Confocal Multi-Point", envision company, May 2, 2017, www.envision.co.kr.

* cited by examiner

APPARATUS FOR MANUFACTURING DISPLAY DEVICE AND METHOD OF MANUFACTURING THE DISPLAY DEVICE

CROSS-REFERENCE TO RELATED APPLICATION(S)

This application claims priority to and benefits of Korean Patent Application No. 10-2020-0033303 under 35 U.S.C. § 119, filed on Mar. 18, 2020, in the Korean Intellectual Property Office, the entire contents of which are incorporated herein by reference.

BACKGROUND

1. Technical Field

One or more embodiments relate to an apparatus and a method, and, to an apparatus for manufacturing a display device and a method of manufacturing the display device.

2. Description of the Related Art

Mobile electronic apparatuses are widely in use. In terms of mobile electronic apparatuses, not only miniaturized electronic apparatuses such as mobile phones but also tablet personal computers (PC) have been widely used recently.

To support various functions, the mobile electronic apparatuses may include a display device to provide a user with visual information such as an image. Recently, because parts driving a display device have been miniaturized, the proportion of the display device in an electronic apparatus may gradually increase and a structure that may be bent to have a predetermined angle from a flat state is also under development.

In order to manufacture such a display device, various layers may be formed. In this case, at least one of the various layers may be formed by dropping a liquid droplet on a substrate by using a head. In this case, in order to realize a precise image of the display device, it may be necessary to accurately supply a liquid droplet to a desired position by using the head.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In general, in a case that a droplet, for example a liquid droplet, drops on a substrate, a volume of the liquid droplet may be measured after the liquid droplet falls down to the substrate, to calculate the volume of the liquid droplet, and other parameters of the liquid droplet. In this case, an accurate volume of the liquid droplet may not be known, and a separate test table of film may be required to measure the volume of the liquid droplet, which may require a large space and a heavy cost. One or more embodiments include an apparatus for manufacturing a display device and a method of manufacturing the display device that may accurately measure a liquid droplet while simplifying a structure and reducing a cost.

Additional aspects will be set forth in part in the description which follows and, in part, will be apparent from the description, or may be learned by practice of the presented embodiments of the disclosure.

According to an embodiment, an apparatus for manufacturing a display device may include a droplet discharge unit including a nozzle that discharges a droplet, at least one sensor that senses a partial shape of an outer surface of the droplet projected onto a plane and a cross-sectional shape of the droplet projected onto the plane, the plane being on a falling path of the droplet discharged from the droplet discharge unit, and a controller that calculates, based on a result sensed by the at least one sensor, at least one of a volume of the droplet, a falling speed of the droplet, a discharge angle at which the droplet is discharged from the nozzle, and a falling path of the droplet moving from the nozzle to a substrate.

The at least one sensor may include a confocal microscope or a chromatic confocal line sensor.

The at least one sensor may include a plurality of sensors, and the plurality of sensors may be spaced apart from each other along the falling path of the droplet.

The apparatus may further include a reflection unit that bends laser light emitted from the at least one sensor and bends light reflected from the droplet.

A predetermined number of the plurality of sensors may sense the partial shape of the outer shape of the droplet, and another predetermined number of the plurality of sensors may sense the cross-sectional shape of the droplet.

The at least one sensor may include a plurality of sensors, and a predetermined number of the plurality of sensors and the another predetermined number of the plurality of sensors may be arranged in opposite directions with respect to a moving path of the droplet.

A predetermined number of the plurality of sensors may sense the partial shape of the outer shape of the droplet, and another predetermined number of the plurality of sensors may sense the cross-sectional shape of the droplet.

The controller may calculate a three-dimensional shape of the droplet by rotating the partial shape of the outer surface of the droplet sensed by the sensor with respect to the falling path of the droplet, and may calculate the volume of the droplet based on the three-dimensional shape of the droplet.

The at least one sensor may sense the droplet at predetermined time intervals, and the controller may calculate the falling path of the droplet or the discharge angle of the droplet by connecting centers of the droplet.

The at least one sensor may sense, at a predetermined time interval, the partial shape of the outer surface of the droplet falling down on a plane perpendicular to a falling direction of the droplet.

The controller may convert the partial shape of the outer surface of the droplet into a planar shape on the plane perpendicular to the falling direction of the droplet, and the controller may calculate a three-dimensional shape of the droplet based on the planar shape of the droplet.

The at least one sensor may sense the droplet at a predetermined time interval when the droplet falls down, and the controller may calculate the falling speed of the droplet based on a distance by which the droplet has moved for a predetermined period of time.

The apparatus may further include an accommodation unit that accommodates the droplet discharged from the nozzle.

The at least one sensor may be arranged in a direction perpendicular to a moving path of the droplet.

According to an embodiment, a method of manufacturing a display device may include discharging a droplet, sensing at least one of a partial shape of an outer surface of the droplet and a cross-sectional shape of the droplet projected onto a plane on a falling path of the droplet, and calculating at least one of a volume of the droplet, a falling speed of the droplet, a falling path of the droplet, and a discharge angle of the droplet, based on at least one of the partial shape of the outer surface of the droplet and the cross-sectional shape of the droplet.

The method may further include calculating a three-dimensional shape of the droplet based on at least one of the partial shape of the outer surface of the droplet and the cross-sectional shape of the droplet.

The method may further include calculating the three-dimensional shape of the droplet at a predetermined time interval.

The method may further include calculating at least one of the discharge angle of the droplet and the falling path of the droplet by connecting centers of the three-dimensional shape of the droplet.

The method may further include sensing the partial shape of the outer surface of the droplet on a plane perpendicular to the falling path of the droplet, and calculating the cross-sectional shape of the droplet on the plane perpendicular to the falling path, based on the partial shape of the outer surface of the droplet.

The method may further include sensing, at a predetermined time interval, the partial shape of the outer surface of the droplet on the plane perpendicular to the falling path of the droplet.

The method may further include calculating a three-dimensional shape of the droplet based on the cross-sectional shape of the droplet calculated at the predetermined time interval.

The method may further include sensing the cross-sectional shape of the droplet projected onto a plane including the falling path of the droplet, and calculating a three-dimensional shape of the droplet by rotating the cross-sectional shape of the droplet with respect to the falling path of the droplet.

The method may further include sensing the partial shape of the outer surface of the droplet on a plane including the falling path of the droplet, and calculating the cross-sectional shape of the droplet on the plane including the falling path, based on the partial shape of the outer surface of the droplet.

The method may further include calculating a three-dimensional shape of the droplet by rotating the cross-sectional shape of the droplet with respect to the falling path of the droplet.

According to an embodiment, a method of manufacturing a display device may include discharging a droplet, sensing at least one of a partial shape of an outer surface of the droplet and a cross-sectional shape of the droplet projected onto a plane on a falling path of the droplet, calculating at least one of a volume of the droplet, a falling speed of the droplet, a falling path of the droplet, and a discharge angle of the droplet, based on at least one of the partial shape of the outer surface of the droplet and the cross-sectional shape of the droplet, and controlling at least one of a discharge amount and a discharge speed of the droplet, based on at least one of the volume of the droplet, the falling speed of the droplet, the falling path of the droplet, and the discharge angle of the droplet.

The above and other aspects, features, and advantages of certain embodiments of the disclosure will be more apparent from the following description, the accompanying drawings, and claims.

This general aspect may be implemented by a system, a method, a computer program, or a combination of a system, a method, a computer program.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
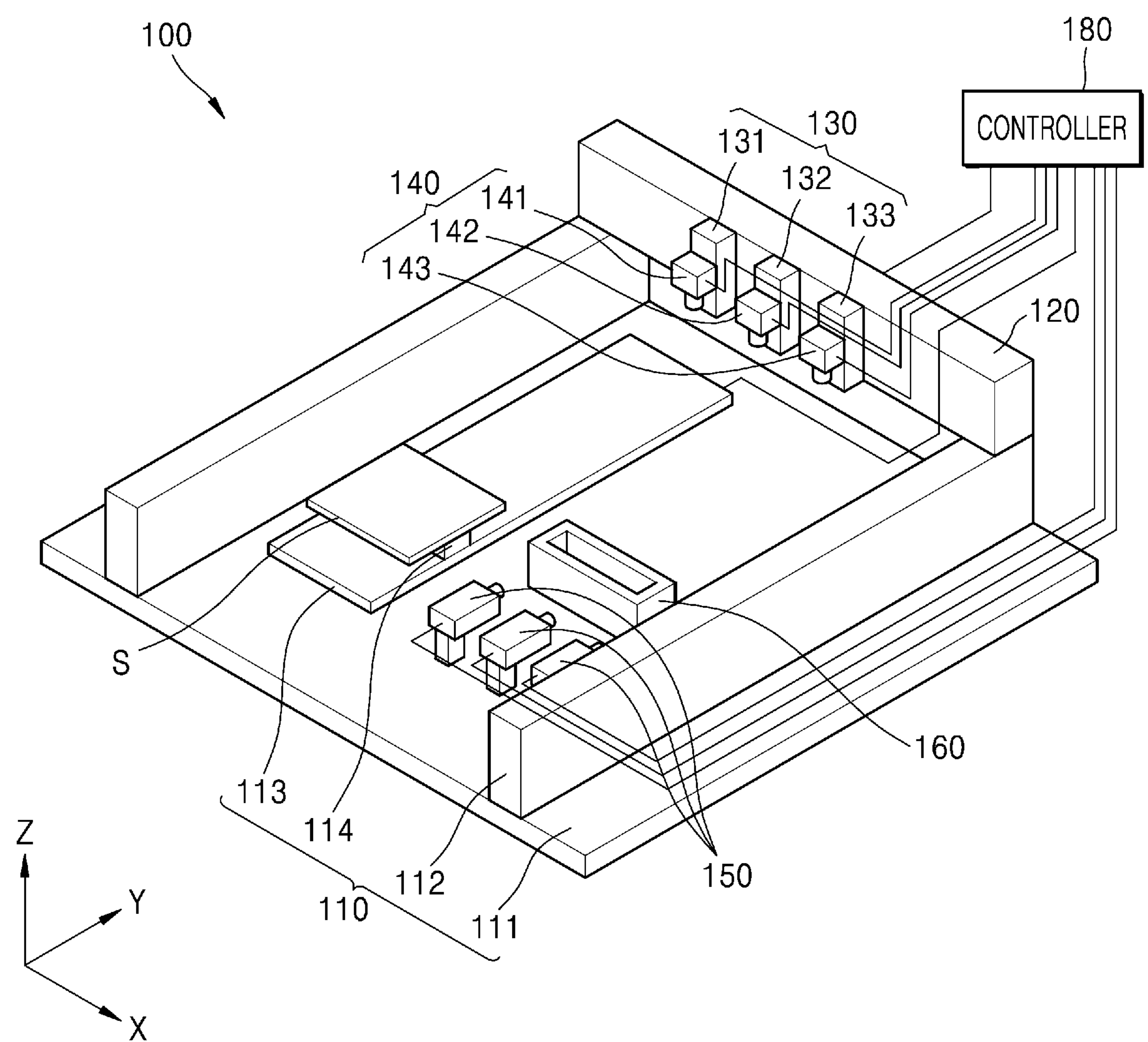
FIG. 1 is a perspective view of an apparatus for manufacturing a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Because various modifications may be applied to the disclosure and one or more embodiments may be implemented, embodiments will be shown in the drawings and described in detail in the detailed description. Effects and features of the disclosure and methods of achieving the same will be apparent with reference to embodiments described below in detail with the accompanying drawings. However, the disclosure is not limited to the embodiments disclosed below and may be implemented in various forms.

Hereinafter, the disclosure will be described in detail by explaining embodiments of the disclosure with reference to the attached drawings. Like reference numerals in the drawings denote like elements, and redundant explanations thereof are omitted.

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

In the following description, an expression used in the singular form encompasses the expression of the plural form, unless it has a clearly different meaning in the context.

In the following description, it will be understood that the terms such as "including," "having," and "comprising" are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

In the following description, it will be understood that when an element, such as a layer, a film, an area, or a plate, is referred to as being "on" another element, the element may be directly on the other element or intervening elements may be present thereon.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Sizes of elements in the drawings may be exaggerated for convenience of explanation. In other words, since sizes and thicknesses of elements in the drawings are arbitrarily illustrated for convenience of explanation, the following embodiments are not limited thereto.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

In the following examples, the X-axis, the Y-axis, and the Z-axis are not limited to three axes of the rectangular coordinate system, and may be interpreted in a broader sense. For example, the X-axis, the Y-axis, and the Z-axis may be perpendicular to one another, or may represent different directions that are not perpendicular to one another.

As used herein, the term "unit" or "module" denotes a structure or element as illustrated in the drawings and as described in the specification. However, the disclosure is not limited thereto. The term "unit" or "module" is not to be limited to that which is illustrated in the drawings Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In a case that a certain embodiment may be implemented differently, a specific process order may be performed differently from the described order. For example, two consecutively described processes may be performed substantially at the same time or performed in an order opposite to the described order.

Figure 2:
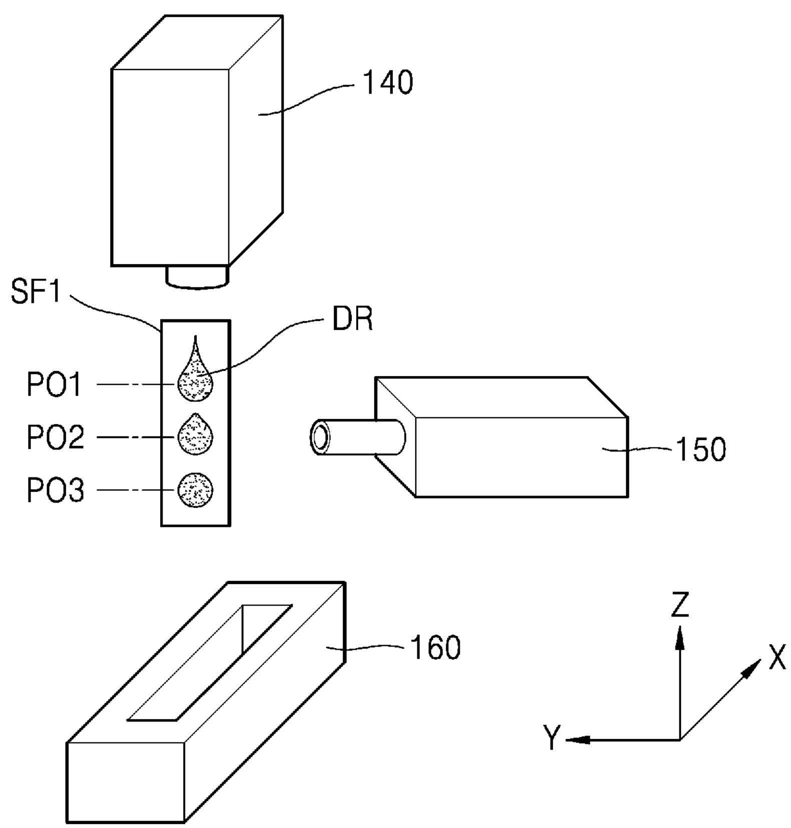
FIG. 2 is a perspective view of a portion of the apparatus for manufacturing a display device shown in FIG. 1.

FIG. 1 is a perspective view of an apparatus 100 for manufacturing a display device according to an embodiment. FIG. 2 is a perspective view of a portion of the apparatus 100 for manufacturing the display device shown in FIG. 1.

Referring to FIGS. 1 and 2, the apparatus 100 for manufacturing the display device may include a support unit 110, a gantry 120, a movement unit 130, a droplet discharge unit 140, a sensor unit 150, an accommodation unit 160, and a controller 180.

The support unit 110 may include a stage 111, a guide member 112, a substrate movement member 113, and a substrate rotation member 114.

The stage 111 may include an unlined mark (not shown) for aligning a display substrate S.

Here, the display substrate S may be a display device being manufactured. The display substrate S may include glass or a polymer resin such as polyethersulfone, polyarylate, polyetherimide, polyethylene naphthalate, polyethylene terephthalate, polyphenylene sulfide, polyimide, polycarbonate (PC), cellulose triacetate (TAC), cellulose acetate propionate, for example.

The guide members 112 may be arranged or disposed to be spaced apart from each other on opposite sides with the substrate movement member 113 therebetween. A length of the guide member 112 may be greater than a length of an edge of the display substrate S. In this case, the length of the guide member 112 and the length of the edge of the display substrate S may be measured in a Y-direction of FIG. 1.

The gantry 120 may be arranged or disposed on the guide member 112. In an embodiment, the guide member 112 may include a constant rail to allow the gantry 120 to linearly move in a lengthwise direction of the guide member 112. As an example, the guide member 112 may include a linear motion rail.

The substrate movement member 113 may be arranged or disposed on the stage 111. The substrate movement member 113 may extend in the lengthwise direction of the guide member 112. For example, referring to FIG. 1, the substrate movement member 113 may extend in the Y-direction. In addition, the substrate movement member 113 may include a rail to allow the substrate rotation member 114 to linearly move. As an example, the substrate movement member 113 may include a linear motion rail.

The substrate rotation member 114 may be arranged or disposed to be rotatable on the substrate movement member 113. In a case that the substrate rotation member 114 rotates, the display substrate S on the substrate rotation member 114 may rotate. In an embodiment, the substrate rotation member 114 may rotate about a rotation axis perpendicular to one surface of the stage 111 on which the display substrate S may be seated. It is to be understood that perpendicular may include substantially perpendicular. In a case that the substrate rotation member 114 rotates about the rotation axis perpendicular to the one surface of the stage 111 on which the display substrate S is seated, the display substrate S on the substrate rotation member 114 may also rotate about the rotation axis perpendicular to the one surface of the stage 111 on which the display substrate S is seated. In this case, the substrate rotation member 114 may fix the display substrate S after the display substrate S is seated. For example, the substrate rotation member 114 may include one of a vacuum chuck, an electrostatic chuck (ESC), or an adhesive chuck.

The gantry 120 may be arranged or disposed on the guide member 112. For example, the gantry 120 may be arranged or disposed on the guide members 112 that are arranged or disposed to be spaced apart from each other on opposite sides with the substrate movement member 113 therebetween.

The gantry 120 may move in the lengthwise direction of the guide member 112. In an embodiment, the gantry 120 may be linearly moved manually or may include a motor cylinder or the like to linearly move automatically. For example, the gantry 120 may include a linear motion block that moves along the linear motion rail, and thus, may linearly move automatically.

The movement unit 130 may linearly move on the gantry 120. For example, the gantry 120 may include a constant rail to allow the movement unit 130 to linearly move. In this case, the droplet discharge unit 140 may be arranged or disposed on the movement unit 130 and may move together with the movement unit 130 in a case that the movement unit 130 moves.

The movement unit 130 and the droplet discharge unit 140 may be arranged or disposed in various manners. For example, one movement unit 130 and one droplet discharge unit, for example, a liquid droplet discharge unit 140 may be provided, respectively. In this case, the liquid droplet discharge unit 140 may include one head and at least one nozzle arranged or disposed on the head to discharge a droplet, for example, a liquid droplet DR.

As an example, liquid droplet discharge units 140 may be provided, and one movement unit 130 may be provided. In this case, the liquid droplet discharge units 140 may be arranged or disposed on the one movement unit 130 to move simultaneously along with a movement of the movement unit 130. In this case, each liquid droplet discharge unit 140 may include at least one head having at least one nozzle.

As an example, movement units 130 and liquid droplet discharge units 140 may be provided, respectively. In this case, one liquid droplet discharge unit 140 may be arranged or disposed on one movement unit 130 or some or a predetermined number of the liquid droplet discharge units 140 may be arranged or disposed on one movement unit 130, and the others of the liquid droplet discharge units 140 may be arranged or disposed on another movement unit 130.

Hereinbelow, for convenience of description, a case where one liquid droplet discharge unit 140 is arranged or disposed on one movement unit 130 will be mainly described in detail.

The movement unit 130 may include movement units 130. In this case, the movement unit 130 may be arranged or disposed such that the number of movement units 130 corresponds to the number of liquid droplet discharge units 140. For example, the movement unit 130 may include a first movement unit 131, a second movement unit 132, and a third movement unit 133.

A distance between the first movement unit 131 and the second movement unit 132 may be the same as or similar to a distance between the second movement unit 132 and the third movement unit 133. In an embodiment, the distance between the first movement unit 131 and the second movement unit 132 may be different from the distance between the second movement unit 132 and the third movement unit 133. In this case, the first to third movement units 131 to 133 may move independently of each other.

The movement unit 130 may linearly move on the gantry 120. As an example, the movement unit 130 may move in a lengthwise direction of the gantry 120. For example, at least one of the first movement unit 131, the second movement unit 132, and the third movement unit 133 may move in an x-direction or an −x direction. In an embodiment, the movement unit 130 may be linearly moved manually. In an embodiment, the movement unit 130 may include a motor, a cylinder, for example, to linearly move automatically. For example, the movement unit 130 may include a linear motion block that moves along the linear motion rail.

The liquid droplet discharge unit 140 may be arranged or disposed in the movement unit 130. For example, a first liquid droplet discharge unit 141 may be arranged or disposed in the first movement unit 131. As another example, a second liquid droplet discharge unit 142 may be arranged or disposed in the second movement unit 132. As another example, a third liquid droplet discharge unit 143 may be arranged or disposed in the third movement unit 133.

The liquid droplet discharge unit 140 may discharge a liquid droplet DR to the display substrate S or the accommodation unit 160. In this case, the liquid droplet DR may be red, green, or blue ink, in which pigment particles are mixed in a liquid crystal, an alignment solution, or a solvent. In an embodiment, the liquid droplet DR may be a polymer or low molecular weight organic material corresponding to an emission layer of an organic light-emitting diode display device. In addition, in an embodiment, the liquid droplet DR may include a solution containing inorganic particles such as quantum dot materials or the like within the spirit and the scope of the disclosure.

An amount of liquid droplets DR supplied independently from the first liquid droplet discharge unit 141, the second liquid droplet discharge unit 142, and the third liquid droplet discharge unit 143 may be adjusted. In this case, each of the first liquid droplet discharge unit 141, the second liquid droplet discharge unit 142, and the third liquid droplet discharge unit 143 may be electrically connected to the controller 180. Accordingly, the amount of the liquid droplets DR discharged respectively from the first liquid droplet discharge unit 141, the second liquid droplet discharge unit 142, and the third liquid droplet discharge unit 143 by the controller 180 may be adjusted. In this case, at least one of the first to third liquid droplet discharge units 141 to 143 may include at least one nozzle that discharges one liquid droplet DR. In this case, in a case that nozzles are provided, at least one of the nozzles may provide a liquid droplet DR into an opening 19OP shown in FIG. 15. For example, one nozzle may provide a liquid droplet DR into one opening 19OP. In an embodiment, at least two nozzles may provide a liquid droplet DR into one opening 19OP.

The sensor unit 150 may measure a partial shape of an outer surface of a liquid droplet DR discharged from the liquid droplet discharge unit 140 or a cross-sectional shape of the liquid droplet DR with respect to an arbitrary surface of the droplet DR. The sensor unit 150 may have various forms. For example, the sensor unit 150 may be a confocal microscope, an interferometric microscope, or a chromatic confocal line sensor. For example, the confocal microscope may obtain two-dimensional images of an object with different depths, and may reconstruct a three-dimensional structure of the object based on the two-dimensional images. The confocal microscope may be, for example, a chromatic confocal microscope, a chromatic line confocal microscope, for example, within the spirit and the scope of the disclosure. The interferometric microscope may observe and quantitatively measure changes in the unevenness of a microstructure, phase changes, for example, of an object. The object may be an object to be measured such that the object may be the liquid droplet but the disclosure is not limited thereto. For example, the droplet may be a liquid droplet or a fluid droplet. The interferometric microscope may be, for example, a laser interferometric microscope, a white light interferometric microscope, for example, within the spirit and the scope of the disclosure. Hereinbelow, for convenience of description, a case where the sensor unit 150 may include a chromatic confocal line sensor will be mainly described in detail.

In an embodiment, one sensor unit 150 may be provided to sense liquid droplets DR at once. In an embodiment, sensor units 150 may be provided and arranged or disposed such that one sensor unit 150 corresponds to one liquid droplet discharge unit 140, to sense a liquid droplet DR discharged from one liquid droplet discharge unit 140. In an embodiment, sensor units 150 may be provided, one of the sensor units 150 may sense at least one liquid droplet DR discharged from some or a predetermined number of the liquid droplet discharge units 140, and another of the sensor units 150 may sense at least one liquid droplet DR discharged from others of the liquid droplet discharge units 140. Hereinbelow, for convenience of description, a case where sensor units 150 may be provided and one sensor unit 150 senses a liquid droplet DR discharged from one liquid droplet discharge unit 140 will be mainly described in detail.

In an embodiment, the sensor unit 150 may be arranged or disposed to be fixed on the stage 111. In this case, sensor units 150 may be provided, and each sensor unit 150 may be arranged or disposed to correspond to each liquid droplet discharge unit 140. In an embodiment, although not shown, the sensor unit 150 may be slidably arranged or disposed on the stage 111. In this case, the number of sensor units 150 may be less than the number of liquid droplet discharge units 140, and a position of the sensor unit 150 may be changed to correspond to a position of a liquid droplet discharge unit 140 to be measured.

The accommodation unit 160 may be arranged or disposed between the guide members 112. In this case, the accommodation unit 160 may temporarily store a liquid droplet DR in a case that the liquid droplet DR falling down from the liquid droplet discharge unit 140 is to be measured. The accommodation unit 160 may be arranged or disposed on the stage 111. In an embodiment, the accommodation unit 160 may be arranged or disposed below the stage 111. In this case, a hole may be formed in a portion of the stage 111 where the accommodation unit 160 may be arranged or disposed.

Based on a result measured by the sensor unit 150, the controller 180 may calculate at least one of a three-dimensional shape of the liquid droplet DR, a falling speed of the liquid droplet DR, a falling path of the liquid droplet DR, and a discharge angle of the liquid droplet DR. In addition, the controller 180 may totally control the apparatus 100 for manufacturing a display device.

The apparatus 100 for manufacturing a display device may form an organic material layer on the display substrate S by supplying the liquid droplet DR to the display substrate S. In this case, it is necessary for the apparatus 100 for manufacturing a display device to accurately supply, to the display substrate S, the liquid droplet DR being supplied to the display substrate S. In order to identify this, after each liquid droplet discharge unit 140 is arranged or disposed to correspond to the accommodation unit 160, the sensor unit 150 may sense the liquid droplet DR as the liquid droplet DR is discharged to the accommodation unit 160. In an embodiment, each liquid droplet discharge unit 140 may discharge the liquid droplet DR to the display substrate S, and the sensor unit 150 may sense the liquid droplet DR. In addition, in an embodiment, although not shown in the drawings, the liquid droplet discharge unit 140 may supply the liquid droplet DR to a test substrate (not shown), and the sensor unit 150 may sense the liquid droplet DR, the test substrate being seated on a support plate or the like separately provided in a portion where the substrate rotation member 114 or the accommodation unit 160 may be arranged or disposed, and having the same or similar shape as the display substrate S. However, hereinbelow, for convenience of description, a case where the liquid droplet discharge unit 140 discharges the liquid droplet DR to the accommodation unit 160 and the sensor unit 150 senses the liquid droplet DR will be mainly described in detail.

The sensor unit 150 may sense the liquid droplet DR between the liquid droplet discharge unit 140 and the accommodation unit 160. In this case, the sensor unit 150 may sense a partial shape of an outer surface of the liquid droplet DR. For example, the sensor unit 150 may irradiate laser light onto a first plane SF1 of an outer shape of the liquid droplet DR, which may be parallel to an X-Z plane of FIG. 2, and may sense the laser light being reflected and returning from the liquid droplet DR. It is to be understood that parallel may include substantially parallel.

As an example, in a case that the liquid droplet DR falls down from the liquid droplet discharge unit 140, a position of the liquid droplet DR may be changed at each period of time. For example, a liquid droplet DR at a first position PO1 after a first period of time elapses immediately after falling down from the liquid droplet discharge unit 140 may have a longer tail due to an attractive force with a nozzle of the liquid droplet discharge unit 140. In addition, a liquid droplet DR at a second position PO2 after a second period of time elapses immediately after falling down from the liquid droplet discharge unit 140 may have a shorter tail than the tail of the liquid droplet DR at the first position PO1. A liquid droplet DR at a third position PO3 after a third period of time elapses immediately after falling down from the liquid droplet discharge unit 140 may have a shorter tail than the tail of the liquid droplet DR at the second position PO2, and thus, the tail may appear almost like a sphere.

The sensor unit 150 may sense the liquid droplet DR at the first period of time, the second period of time, and the third period of time as described above. In this case, an interval between a time in a case that the liquid droplet DR starts falling down from the liquid droplet discharge unit 140 and the first period of time, an interval between the first period of time and the second period of time, and an interval between the second period of time and the third period of time may be the same or similar. For example, the sensor unit 150 may sense the position of the liquid droplet DR that falls down over time by sensing the liquid droplet DR at certain or predetermined time intervals.

The controller 180 may calculate the three-dimensional shape of the liquid droplet DR through the partial shape of the outer surface of the liquid droplet DR sensed as described above. In this case, the controller 180 may calculate a volume of the liquid droplet DR based on the three-dimensional shape of the liquid droplet DR. In addition, the controller 180 may calculate the falling path of the liquid droplet DR based on the position of the liquid droplet DR at each time sensed by the sensor unit 150. The controller 180 may calculate the discharge angle of the liquid droplet DR by connecting the falling path of the liquid droplet DR to a point at which the liquid droplet DR is first discharged and calculating an angle between a lengthwise direction of the nozzle of the liquid droplet discharge unit 140 and the falling path. The controller 180 may calculate a speed of the liquid droplet DR based on the position of the liquid droplet DR at each time.

The controller 180 may control at least one of the liquid droplet discharge unit 140 and the movement unit 130 based on at least one of the volume of the liquid droplet DR, the falling path of the liquid droplet DR, the discharge angle of the liquid droplet DR, and a discharge speed of the liquid droplet DR.

For example, the controller 180 may adjust an amount of the liquid droplet DR discharged from the liquid droplet discharge unit 140 or may adjust the discharge speed of the liquid droplet DR. In addition, the position of the liquid droplet discharge unit 140 is changed by the movement unit 130 to change the discharge angle of the liquid droplet DR and the falling path of the liquid droplet DR, such that the liquid droplet DR may land at an accurate position on the display substrate S. In an embodiment, the liquid droplet discharge unit 140 may be washed according to the discharge angle of the liquid droplet DR or the falling path of the liquid droplet DR, or a moving speed of the display substrate S or a moving speed of the liquid droplet discharge unit 140 may be controlled. The control method described above will be described in detail below.

Accordingly, the apparatus 100 for manufacturing a display device and the method of manufacturing the display device may accurately supply an accurate amount of the liquid droplet DR to an accurate position on the display substrate S.

In addition, the apparatus 100 for manufacturing a display device and the method of manufacturing the display device may manufacture a precise display device.

Hereinbelow, a method of measuring the falling path of the liquid droplet DR, the falling speed of the liquid droplet DR, the discharge angle of the liquid droplet DR, and the volume of the liquid droplet DR described above will be described in detail.

Figure 3A:
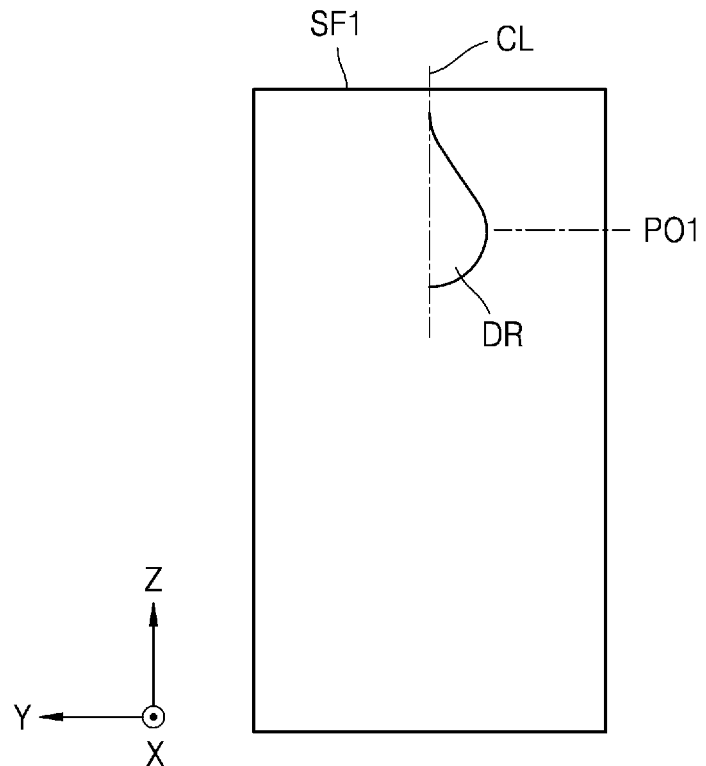
FIG. 3A is a front view of a partial shape of a liquid droplet at a first position shown in FIG. 2.
Figure 3B:
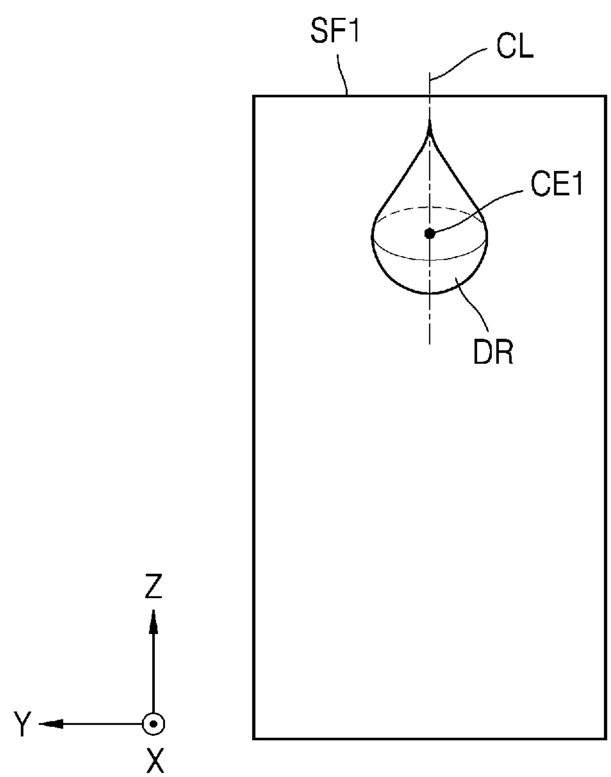
FIG. 3B is a perspective view of a three-dimensional shape of a liquid droplet calculated through the partial shape of the liquid droplet shown in FIG. 3A.

FIG. 3A is a front view of a partial shape of a liquid droplet DR at a first position PO1 shown in FIG. 2. FIG. 3B is a perspective view of a three-dimensional shape of a liquid droplet DR calculated through the partial shape of the liquid droplet DR shown in FIG. 3A. Hereinbelow, the same reference numerals as those of FIGS. 1 and 2 denote the same elements.

Referring to FIGS. 3A and 3B, in a case that the liquid droplet DR is discharged from the liquid droplet discharge unit 140 and is at a first position PO1 within a first time, the sensor unit 150 may sense a portion of an outer surface of a cross-section of the liquid droplet DR at the first position PO1 arranged or disposed on a first plane SF1. In this case, because a distance that laser light emitted from the sensor unit 150 reaches may be different according to a color of the laser, the sensor unit 150 may sense a distance from the sensor unit 150 to an outer surface of the liquid droplet DR by sensing a wavelength of laser light that hits the liquid droplet DR and is reflected and returns. In this case, the sensor unit 150 may be arranged or disposed in a direction perpendicular to the falling path of the liquid droplet DR. For example, the sensor unit 150 may be arranged or disposed on a side surface (i.e., an X-axis direction of FIG. 3A) of the falling path of the liquid droplet DR.

As shown in FIG. 3A, the sensor unit 150 may sense a portion of an outer surface of the liquid droplet DR that may include the falling path of the liquid droplet DR or may be arranged or disposed on the first plane SF1 parallel to the falling path of the liquid droplet DR.

The controller 180 may calculate a three-dimensional shape of the liquid droplet DR based on a result sensed by the sensor unit 150. As an example, in an embodiment, the controller 180 may assume, as a central line CL, a line connecting both ends of a portion of an outer shape of the liquid droplet DR sensed by the sensor unit 150. In an embodiment, the central line CL may be an arbitrary straight line parallel to a straight line perpendicular to one surface of the display substrate S on which the liquid droplet DR lands. In an embodiment, the central line CL may be the same or similar as the falling path of the liquid droplet DR or may be parallel to the falling path of the liquid droplet DR. In this case, the falling path of the liquid droplet DR may be parallel to a straight line perpendicular to one surface of the display substrate S.

The controller 180 may calculate a three-dimensional shape of the liquid droplet DR by rotating the portion of the outer shape of the liquid droplet DR based on the central line CL as described above.

The controller 180 may store the three-dimensional shape of the liquid droplet DR as described above. In this case, the controller 180 may calculate a first center CE1 of the liquid droplet DR. In this case, the first center CE1 may be a center of gravity of the three-dimensional shape of the liquid droplet DR, a geometric center of the three-dimensional shape of the liquid droplet DR, for example, within the spirit and the scope of the disclosure.

In this case, the controller 180 may calculate a position of the liquid droplet DR on an X-axis, Y-axis, and Z-axis of FIG. 2 using a virtual point at which the X-axis, Y-axis, and Z-axis of FIG. 2 meet as a reference point. For example, the controller 180 may set, as a reference point, a center of ends of the nozzle of the liquid droplet discharge unit 140 from which the liquid droplet DR falls down and may compare the center with the first center CE1 of the liquid droplet DR calculated above to check the amount of movement of the first center CE1 of the liquid droplet DR from the reference point to the X-axis, Y-axis, and Z-axis. In this case, the controller 180 may calculate a distance from the reference point to the first center CE1 of the liquid droplet DR in a Y-axis direction. In addition, the controller 180 may calculate the first center CE1 of the liquid droplet DR based on a result sensed by the sensor unit 150, and then calculate a distance between the first center CE1 of the liquid droplet DR and the reference point in the X-axis direction. In addition, the controller 180 may calculate a distance between the first center CE1 of the liquid droplet DR and the first center CE1 in a Z-axis direction. The controller 180 may calculate each distance as described above, and then calculate and store X, Y, and Z coordinates of the first center CE1 of the liquid droplet DR with respect to the reference point.

Figure 4A:
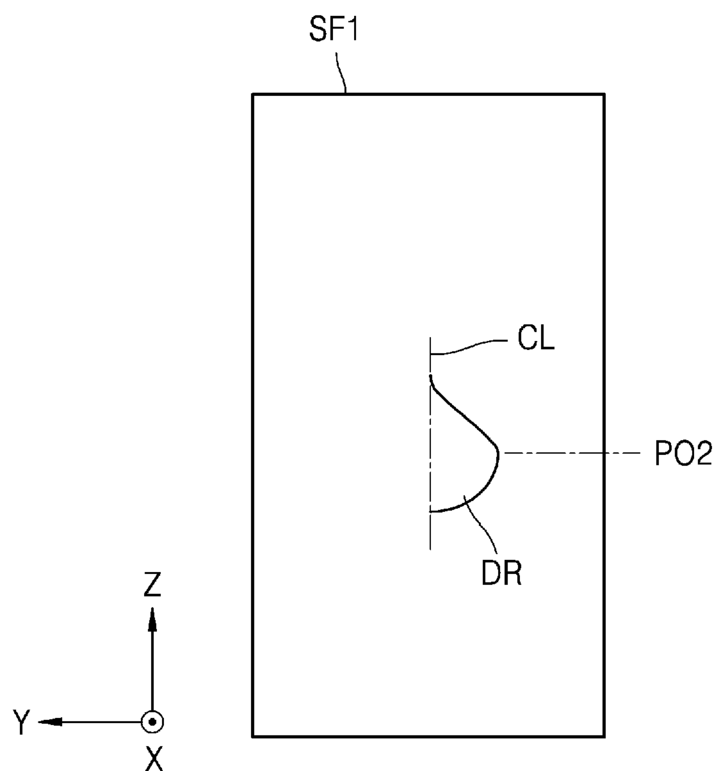
FIG. 4A is a front view of a partial shape of a liquid droplet at a second position shown in FIG. 2.
Figure 4B:
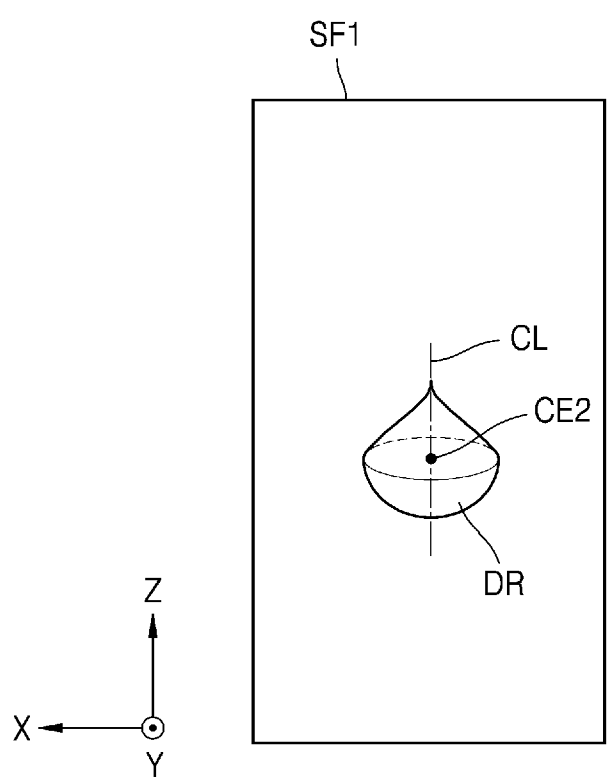
FIG. 4B is a perspective view of a three-dimensional shape of a liquid droplet calculated through the partial shape of the liquid droplet shown in FIG. 4A.

FIG. 4A is a front view of a partial shape of a liquid droplet DR at a second position PO2 shown in FIG. 2. FIG. 4B is a perspective view of a three-dimensional shape of a liquid droplet DR calculated through the partial shape of the liquid droplet DR shown in FIG. 4A. Hereinbelow, the same reference numerals as those of FIGS. 1 and 2 denote the same elements.

Referring to FIGS. 4A and 4B, in a case that a second period of time elapses after the liquid droplet DR is discharged, the liquid droplet DR may further fall from the first position PO1 and be at the second position PO2. The sensor unit 150 may sense the liquid droplet DR at the second position PO2. In this case, a sensing method performed by the sensor unit 150 may be the same as or similar to the method described above. In this case, a first plane SF1, on which a portion of a surface of the liquid droplet DR sensed by the sensor unit 150 is formed, may be the same as or similar to a parallel to the first plane SF1 shown in FIGS. 3A and 3B.

The controller 180 may calculate a three-dimensional shape of the liquid droplet DR at the second position PO2 sensed by the sensor unit 150. In this case, a method of calculating the three-dimensional shape of the liquid droplet DR may be the same as or similar to the method described above.

The controller 180 may calculate the three-dimensional shape of the liquid droplet DR at the second position PO2, and then store the three-dimensional shape of the liquid droplet DR at the second position PO2. In this case, the storing of the three-dimensional shape of the liquid droplet DR may be connected to the controller 180 and may be performed through a storage (not shown) that may be separately provided. In addition, the controller 180 may calculate a second center CE2 of the liquid droplet DR at the second position PO2 from the three-dimensional shape of the liquid droplet DR calculated above.

In this case, with regard to the second center CE2 of the liquid droplet DR at the second position PO2, the controller 180 may calculate positions in Z-axis, X-axis, and Y-axis directions with respect to the reference point. As an example, the controller 180 may calculate each distance as described above, and then calculate and store X, Y, and Z coordinates of the second center CE2 of the liquid droplet DR with respect to the reference point. Such a calculation method may be similar to the calculation method of the first center CE1 described above, and thus, a detailed description thereof will be omitted.

Figure 5A:
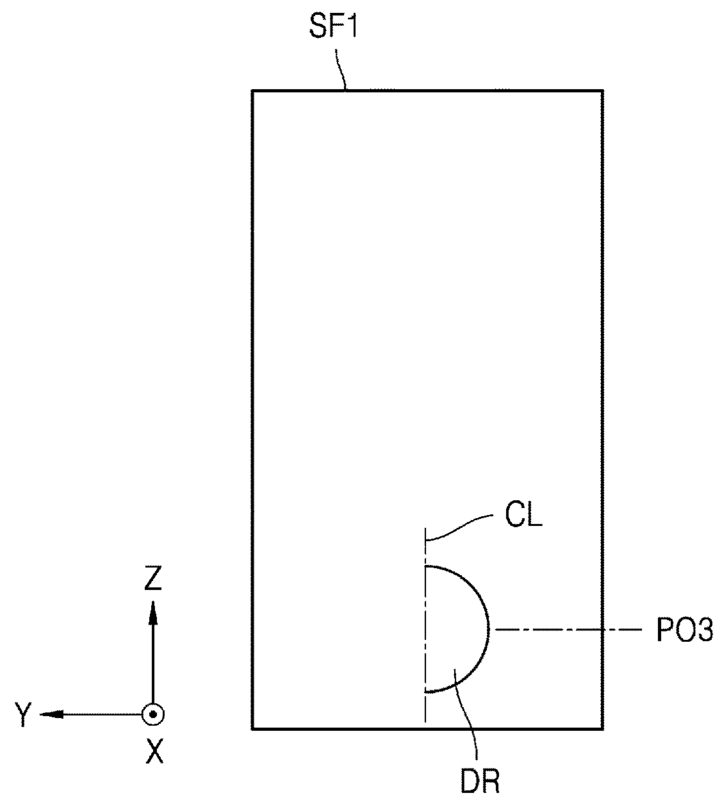
FIG. 5A is a front view of a partial shape of a liquid droplet at a third position shown in FIG. 2.
Figure 5B:
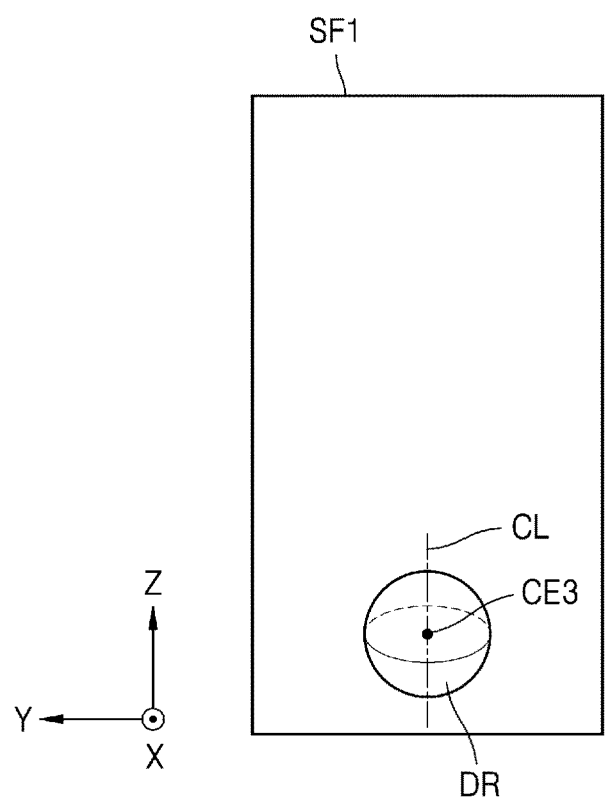
FIG. 5B is a perspective view of a three-dimensional shape of a liquid droplet calculated through the partial shape of the liquid droplet shown in FIG. 5A.
Figure 5C:
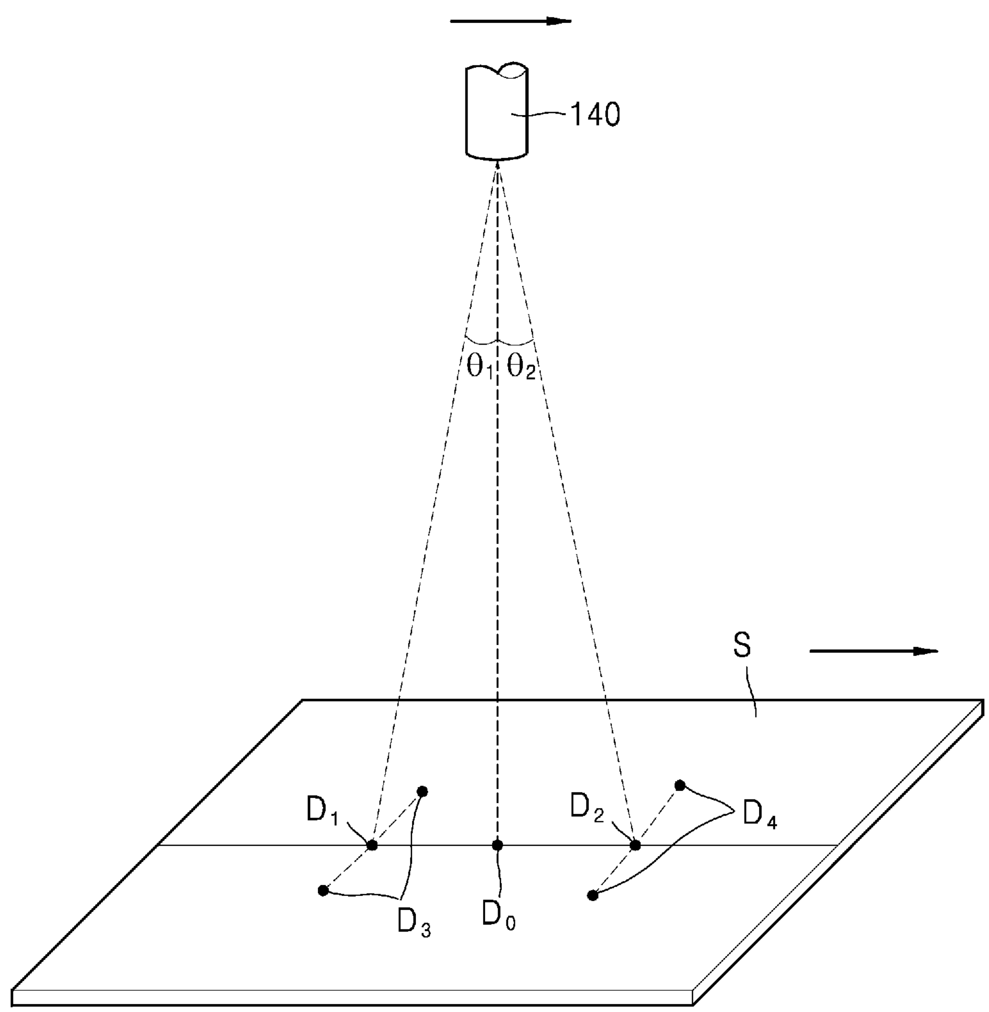
FIG. 5C is a perspective view of a falling path of a liquid droplet discharged from a liquid droplet discharge unit shown in FIG. 2 and a point at which the liquid droplet lands on a display substrate.

FIG. 5A is a front view of a partial shape of a liquid droplet DR at a third position PO3 shown in FIG. 2. FIG. 5B is a perspective view of a three-dimensional shape of a liquid droplet DR calculated through the partial shape of the liquid droplet DR shown in FIG. 5A. FIG. 5C is a perspective view of a falling path of a liquid droplet discharged from the liquid droplet discharge unit 140 shown in FIG. 2 and a point at which the liquid droplet lands on a display substrate S. Hereinbelow, the same reference numerals as those of FIGS. 1 and 2 denote the same elements.

Referring to FIGS. 5A to 5C, the liquid droplet DR may reach a third position PO3 at a third time after being discharged from the liquid droplet discharge unit 140. In this case, the sensor unit 150 may sense the liquid droplet DR reaching the third position PO3. Because a method, performed by the sensor unit 150, of sensing the liquid droplet DR at the third position PO3 is the same as or similar to the method described above, a detailed description thereof will be omitted. In this case, the sensor unit 150 may sense a portion of a surface of a liquid droplet DR formed on a first plane SF1. In this case, the first plane SF1 may be the same as or similar to or substantially parallel to the first plane SF1 shown in FIGS. 3A and 3B and FIGS. 4A and 4B described above.

The controller 180 may calculate a three-dimensional shape of the liquid droplet DR at the third position PO3 based on a result sensed by the sensor unit 150. In addition, the controller 180 may calculate a center of the three-dimensional shape of the liquid droplet DR. In this case, the third position PO3 of the liquid droplet DR at the third position PO3 may be substantially the same as or similar to a sphere.

In a case that the three-dimensional shape of the liquid droplet DR is calculated at the first position PO1, the second position PO2, and the third position PO3 as described above, the controller 180 may calculate a volume of the liquid droplet DR at each position. For example, the controller 180 may calculate the volume of the liquid droplet DR at each position by forming a three-dimensional shape using, as a center line CL, a straight line connecting ends of a portion of a plane shape of the liquid droplet DR at each position and calculating a volume of the three-dimensional shape.

In addition, the controller 180 may calculate a falling speed of the liquid droplet DR based on a time for which the liquid droplet DR moves from one position to another position and a distance between the one position to the other position. For example, the controller 180 may calculate the falling speed of the liquid droplet DR based on a distance from an end of the nozzle of the liquid droplet discharge unit 140 in the Z-axis direction to the first position PO1 and a time taken to move the distance. In addition, the controller 180 may calculate the falling speed of the liquid droplet DR with a distance between the first position PO1 and the second position PO2 in the Z-axis direction and a time for which the liquid droplet DR falls down from the first position PO1 to the second position PO2. The controller 180 may calculate the falling speed of the liquid droplet DR with a distance between the second position PO2 and the third position PO3 in the Z-axis direction and a time for which the liquid droplet DR falls down from the second position PO2 to the third position PO3. The controller 180 may calculate an average falling speed of the liquid droplet DR by arithmetically averaging the falling speed calculated as described above.

The controller 180 may calculate a falling path of the liquid droplet DR by connecting centers of the liquid droplet DR at each position to form a virtual straight line and connecting the straight line to a point at which the liquid droplet DR may be discharged from the liquid droplet discharge unit 140. In addition, the controller 180 may calculate a discharge angle of the liquid droplet DR by determining, as the discharge angle of the liquid droplet DR, an angle formed between the central line CL and the falling path of the liquid droplet DR and calculating the discharge angle. In an embodiment, the controller 180 may determine, as the discharge angle of the liquid droplet DR, an angle between an arbitrary straight line and the falling path of the liquid droplet DR, the arbitrary straight line being perpendicular to an end surface of the nozzle of the liquid droplet discharge unit 140 from which the liquid droplet DR is discharged.

In this case, the controller 180 may calculate the discharge angle of the liquid droplet discharge unit 140 of the liquid droplet discharge unit 140 and the falling path of the liquid droplet DR in the X-axis and Y-axis directions, respectively. For example, as described above, based on each position of the first center CE1, the second center CE2, and a third center CE3, the controller 180 may calculate an angle at which the liquid droplet DR is discharged in the X-axis direction or the Y-axis direction from the end of the nozzle of the liquid droplet discharge unit 140 in the X-axis direction or the Y-axis direction. As an example, as described above, the controller 180 may calculate the discharge angle of the liquid droplet DR and the falling path of the liquid droplet DR by connecting X-axis and Y-axis coordinates of the liquid droplet DR with respect to the reference point.

Through the processes described above, the controller 180 may calculate at least one of the three-dimensional shape of the liquid droplet DR, the volume of the liquid droplet DR, the falling speed of the liquid droplet DR, the falling path of the liquid droplet DR, and the discharge angle of the liquid droplet DR.

Thereafter, as described above, the controller 180 may precisely control the liquid droplet discharge unit 140 based on the above description.

In a case that the liquid droplet DR is supplied to one opening 19OP of a pixel-defining layer 19 (see FIG. 15) using one nozzle, the controller 180 may compare a measured volume of the liquid droplet DR with a predetermined set volume. In a case that it is determined that the measured volume of the liquid droplet DR is less than the set volume, the controller 180 may control the liquid droplet discharge unit 140 to increase an amount of the liquid droplet DR discharged from the liquid droplet discharge unit 140 from an existing amount of the liquid droplet DR. On the other hand, in a case that it is determined that the measured volume of the liquid droplet DR is greater than the set volume, the controller 180 may control the liquid droplet discharge unit 140 to decrease the amount of the liquid droplet DR discharged from the liquid droplet discharge unit 140 from the existing amount of the liquid droplet DR. In addition, in a case that the measured volume of the liquid droplet DR is the same as or similar to the set volume, the controller 180 may control the liquid droplet discharge unit 140 to maintain a current state. In this case, in a case that the predetermined set volume is a total amount of liquid droplets DR to be supplied to the one opening 19OP of the pixel-defining layer 19, the controller 180 may also adjust a time for which the liquid droplet discharge unit 140 discharges the liquid droplet DR based on a measured amount of the liquid droplet DR.

On the other hand, in a case that the liquid droplet DR is supplied to the one opening 19OP of the pixel-defining layer 19 using at least two nozzles, the controller 180 may calculate a volume of the liquid droplet DR discharged from each nozzle. In this case, the controller 180 may control the liquid droplet DR to be provided using at least one of the at least two nozzles so as to correspond to a set volume which is a predetermined total amount of the liquid droplets DR to be supplied to the one opening 19OP of the pixel-defining layer 19. For example, the controller 180 may adjust a volume of the liquid droplet DR discharged from one of the at least two nozzles to correspond to the set volume described above, so as to correspond to the predetermined total amount of the liquid droplets DR, and may stop an operation of the other nozzle. In an embodiment, the controller 180 may control volumes of the liquid droplets DR discharged from at least two nozzles, respectively, so as to correspond to the predetermined total amount of the liquid droplets DR. In addition, in an embodiment, the controller 180 may operate only some or a predetermined number of three or more nozzles and may not operate others so as to correspond to the predetermined total amount of the liquid droplets DR. For example, in a case that the liquid droplet DR is supplied to the one opening 19OP of the pixel-defining layer 19 using three nozzles, in a case where the predetermined total amount of the liquid droplets DR to be supplied to the one opening 19OP of the pixel-defining layer 19 is 20 $mm^3$, an amount of the liquid droplet DR discharged from one of the three nozzles is 9 $mm^3$, an amount of the liquid droplet DR discharged from another of the three nozzles is 10 $mm^3$, an amount of the liquid droplet DR discharged from the other of the three nozzles is 11 $mm^3$, the controller 180 may operate the one and the other of the three nozzles and may not operate the last one of the three nozzles. As described above, a predetermined amount of a liquid droplet DR may be accurately provided to each opening 19OP of the pixel-defining layer 19. In an embodiment, in a case that nozzles may be used, a time at which the liquid droplet DR is discharged from each nozzle is controlled differently, such that the total amount of the liquid droplets DR to be supplied to the one opening 19OP of the pixel-defining layer 19 may match a predetermined value.

The controller 180 may compare a calculated falling speed (or an average falling speed) of a liquid droplet DR with a predetermined set speed. In this case, the controller 180 may control a moving speed of the display substrate S or a moving speed of the liquid droplet discharge unit 140 based on the falling speed as described above. For example, in a case that the calculated falling speed (or the average falling speed) of the liquid droplet DR is less than the predetermined set speed, the controller 180 may control the moving speed of the display substrate S or the moving speed of the liquid droplet discharge unit 140 to be faster than a predetermined set moving speed in a case that the liquid droplet discharge unit 140 performs a process of discharging a liquid droplet DR to the display substrate S. On the other hand, in a case that the calculated falling speed (or the average falling speed) of the liquid droplet DR is greater than the predetermined set speed, the controller 180 may control the moving speed of the display substrate S or the moving speed of the liquid droplet discharge unit 140 to be slower than the predetermined set moving speed in a case that the liquid droplet discharge unit 140 performs the process of discharging the liquid droplet DR to the display substrate S. Accordingly, the liquid droplet DR may be discharged at an accurate position through the processes described above.

In a case that the liquid droplet DR is discharged to the display substrate S and supplied to an opening 19OP of the pixel-defining layer 19, the display substrate S or the liquid droplet discharge unit 140 may be moved. In this case, the controller 180 may control movement of the display substrate S or the liquid droplet discharge unit 140 by comparing a falling path of the liquid droplet DR with a predetermined falling path as described above.

As an example, the controller 180 may compare the falling path of the liquid droplet DR with the predetermined falling path. In this case, the controller 180 may calculate a falling path in a moving direction of the display substrate S or the liquid droplet discharge unit 140 from the falling path of the liquid droplet DR. The controller 180 may calculate a point at which the liquid droplet DR lands on the display substrate S based on the falling path described above. As an example, the controller 180 may determine whether the point at which the liquid droplet DR lands on the display substrate S, which is calculated above, is in an arbitrary straight line that passes a predetermined set point Do and is parallel to the moving direction (i.e., the Y-axis direction of FIG. 5C) of the display substrate S or the liquid droplet discharge unit 140.

In a case that it is determined that the calculated point at which the liquid droplet DR lands is in the arbitrary straight line, the controller 180 may compare the calculated point at which the liquid droplet DR lands with the predetermined set point Do. For example, in a case that the point at which the liquid droplet DR lands, which is calculated by the controller 180, is a first landing point D1 shown in FIG. 5C, the controller 180 may cause the moving speed of the display substrate S or the liquid droplet discharge unit 140 to be slower than the predetermined set moving speed. On the other hand, in a case that the calculated point at which the liquid droplet DR lands is a second landing point D2 shown in FIG. 5C, the controller 180 may cause the moving speed of the display substrate S or the liquid droplet discharge unit 140 to be faster than the predetermined set moving speed.

In a case that it is determined that the calculated point at which the liquid droplet DR lands is not in the arbitrary straight line, the controller 180 may cause the liquid droplet discharge unit 140 to be washed. For example, in a case that the calculated point at which the liquid droplet DR lands is a third landing point D3 and a fourth landing point D4 shown in FIG. 5C, the controller 180 may cause the liquid droplet discharge unit 140 to be washed. In an embodiment, the controller 180 may control the movement unit 130 to adjust a position of the liquid droplet discharge unit 140 such that the calculated point at which the liquid droplet DR lands is in the arbitrary straight line.

The controller 180 may compare a calculated discharge angle of the liquid droplet DR with a predetermined set discharge angle. In this case, the controller 180 may calculate the calculated discharge angle of the liquid droplet DR in the X-axis direction and the Y-axis direction, respectively. In this case, in a case that the calculated discharge angle of the liquid droplet DR is in the X-axis direction of FIG. 5C, which is a direction other than the moving direction of the display substrate S or the liquid droplet discharge unit 140, the controller 180 may control the liquid droplet discharge unit 140 to be washed. In this case, although a method of washing the liquid droplet discharge unit 140 is not shown in the drawings, the liquid droplet discharge unit 140 may be washed using a brush, a cleaning solution, for example, within the spirit and the scope of the disclosure.

In a case that the calculated discharge angle of the liquid droplet DR is not in the X-axis direction of FIG. 5C, which is a direction other than the moving direction of the display substrate S or the liquid droplet discharge unit 140, the controller 180 may compare a discharge angle of the liquid droplet DR calculated in the Y-axis direction of 5C, which is the moving direction of the display substrate S or the liquid droplet discharge unit 140, with a predetermined set angle. In this case, in a case that the calculated discharge angle of the liquid droplet DR has a first discharge angle θ1 shown in FIG. 5C, the controller 180 may control the moving speed of the display substrate S or the moving speed of the liquid droplet discharge unit 140 to be slower than the predetermined set moving speed. On the other hand, in a case that the calculated discharge angle of the liquid droplet DR has a second discharge angle θ2 shown in FIG. 5C, the controller 180 may control the moving speed of the display substrate S or the moving speed of the liquid droplet discharge unit 140 to be faster than the predetermined set moving speed. Accordingly, through the controls described above, the liquid droplet DR may land at an accurate position on the display substrate S according to the discharge angle of the liquid droplet DR.

The controls described above may be performed individually or in combination. For example, in a case that at least two of the three-dimensional shape of the liquid droplet DR, the volume of the liquid droplet DR, the falling speed of the liquid droplet DR, the falling path of the liquid droplet DR, and the discharge angle of the liquid droplet DR are different from predetermined values, the controller 180 may land the liquid droplet DR at an accurate position on the display substrate S by controlling the respective elements of the apparatus for manufacturing a display device in a complex manner.

Figure 6:
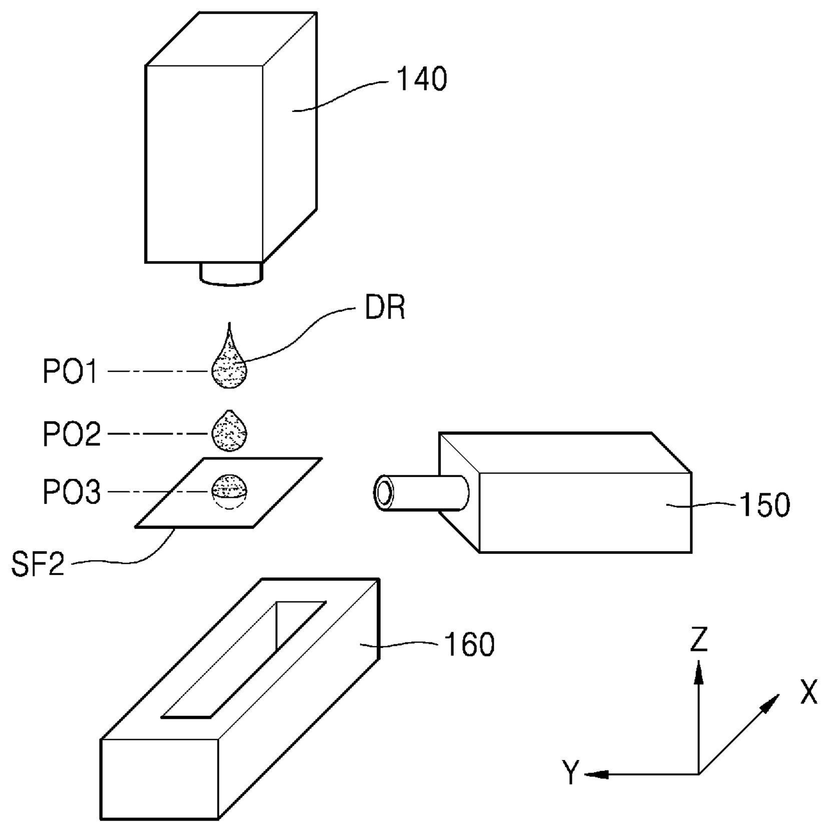
FIG. 6 is a perspective view of a portion of an apparatus for manufacturing a display device according to an embodiment.
Figure 7:
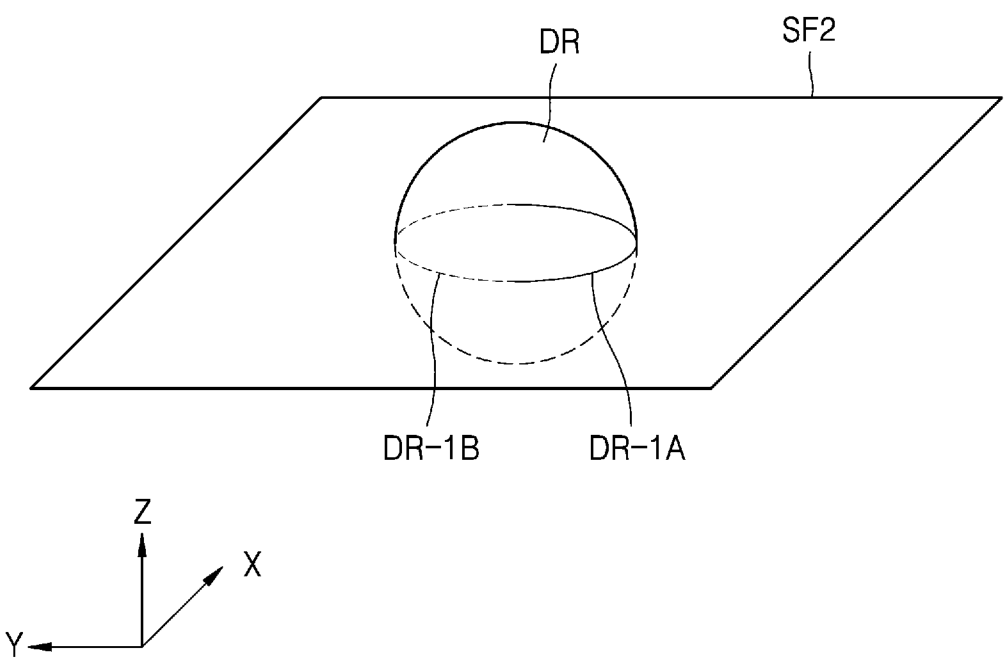
FIG. 7 is a perspective view of a relationship between a liquid droplet and a measurement surface measured by a sensor unit shown in FIG. 6.
Figure 8:
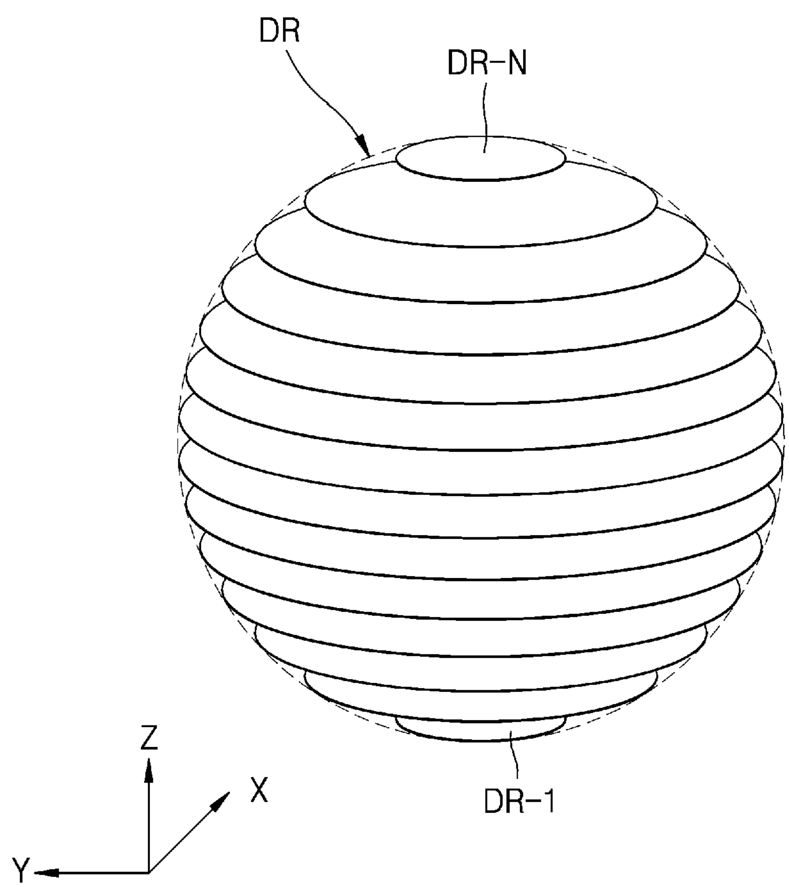
FIG. 8 is a perspective view of planar shapes of a liquid droplet sensed by the sensor unit shown in FIG. 6.

FIG. 6 is a perspective view of a portion of the apparatus for manufacturing a display device according to an embodiment. FIG. 7 is a perspective view of a relationship between a liquid droplet DR and a measurement surface measured by a sensor unit shown in FIG. 6. FIG. 8 is a perspective view of planar shapes of a liquid droplet DR sensed by the sensor unit shown in FIG. 6.

Referring to FIGS. 6 to 8, the apparatus for manufacturing a display device may be similar to that described with reference to FIGS. 1 and 2. In this case, the sensor unit 150 may be a chromatic confocal line sensor.

The sensor unit 150 may irradiate laser light onto an arbitrary second plane SF2 (for example, a plane parallel to an X-Y plane of FIG. 6) perpendicular to a falling path of the liquid droplet DR and may sense a portion of a planar shape of the liquid droplet DR using the laser light that may be reflected and may return. In this case, based on a result sensed by the sensor unit 150, the controller 180 may calculate a shape that the second plane SF2 and the liquid droplet DR overlap each other in a case that passing through the arbitrary second plane SF2 substantially perpendicular to the falling path of the liquid droplet DR.

As an example, in a case that the sensor unit 150 irradiates laser light onto the liquid droplet DR, the laser light hitting the liquid droplet DR may return to the sensor unit 150 again, and thus, the sensor unit 150 may sense a wavelength of the returned laser light. The controller 180 may calculate a portion DR-1A of an outer shape of the liquid droplet DR by analyzing the result sensed by the sensor unit 150. The controller 180 may determine that the portion DR-1A of the outer shape of the liquid droplet DR is a half of an entire planar shape DR-1B of the liquid droplet DR where the liquid droplet DR may overlap the second plane SF2. Accordingly, the controller 180 may calculate the entire planar shape DR-1B of the liquid droplet DR overlapping the second plane SF2 through the portion DR-1A of the outer shape of the liquid droplet DR.

The entire planar shape DR-1B of the liquid droplet DR overlapping the second plane SF2, which may be calculated as described above, may be measured at a certain or a predetermined time interval by the sensor unit 150 over time. In a case that a certain or a predetermined period of time elapses after the liquid droplet DR is discharged, the sensor unit 150 may sequentially sense shapes of the liquid droplet DR on the second plane SF2 by emitting laser light at a certain or a predetermined time interval.

A result of the sensing may be transmitted to the controller 180, and the controller 180 may sequentially stack planar shapes of the liquid droplet DR on the second plane SF2 over time. For example, the controller 180 may stack a first planar shape DR-1 to an N-th planar shape DR-N (where N is a natural number) of the liquid droplet DR according to time intervals as shown in FIG. 8.

In a case that N planar shapes of the liquid droplet DR are stacked as shown in FIG. 8, the controller 180 may calculate a three-dimensional shape of the liquid droplet DR by connecting outer surfaces of the planar shapes of the liquid droplet DR. In a case that the calculating of the three-dimensional shape of the liquid droplet DR is completed, the controller 180 may calculate a volume of the liquid droplet DR.

The controller 180 may control an amount of the liquid droplet DR discharged from the liquid droplet discharge unit 140 based on the volume of the liquid droplet DR calculated as described above. Alternatively, the controller 180 may determine a nozzle to be operated from among at least two nozzles of the liquid droplet discharge unit 140 based on the calculated volume of the liquid droplet DR. In addition, the controller 180 may control a total amount of liquid droplets DR to land on the display substrate S by adjusting a discharge speed of the liquid droplet discharge unit 140.

Accordingly, the apparatus for manufacturing a display device and the method of manufacturing the display device may adjust the total amount of liquid droplets DR supplied to the display substrate S.

Figure 9:
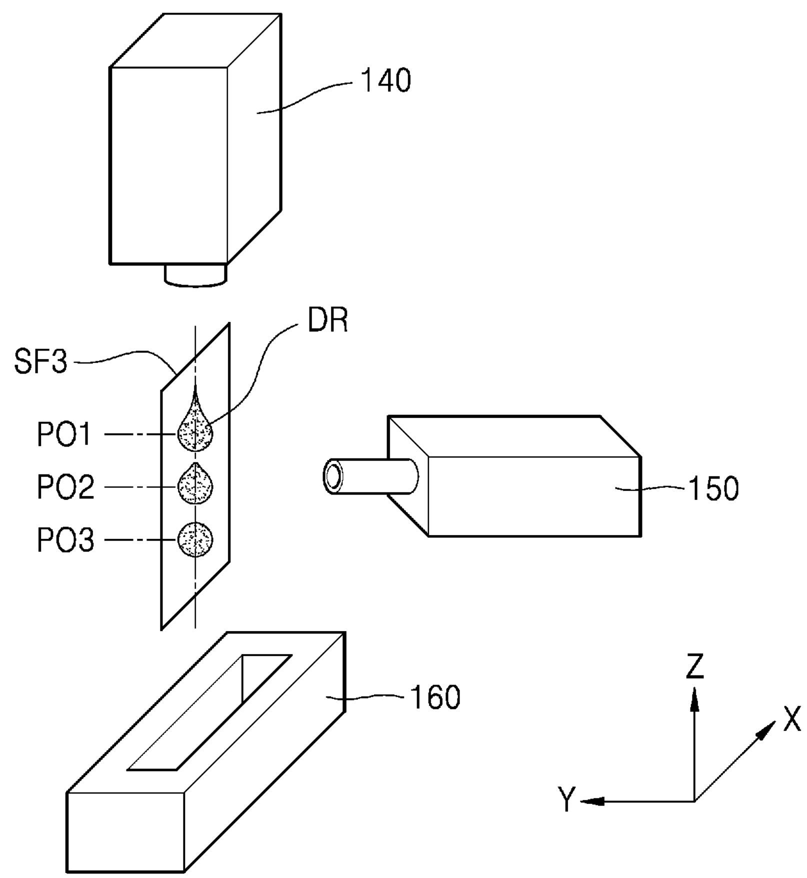
FIG. 9 is a perspective view of a portion of an apparatus for manufacturing a display device according to an embodiment.
Figure 10A:
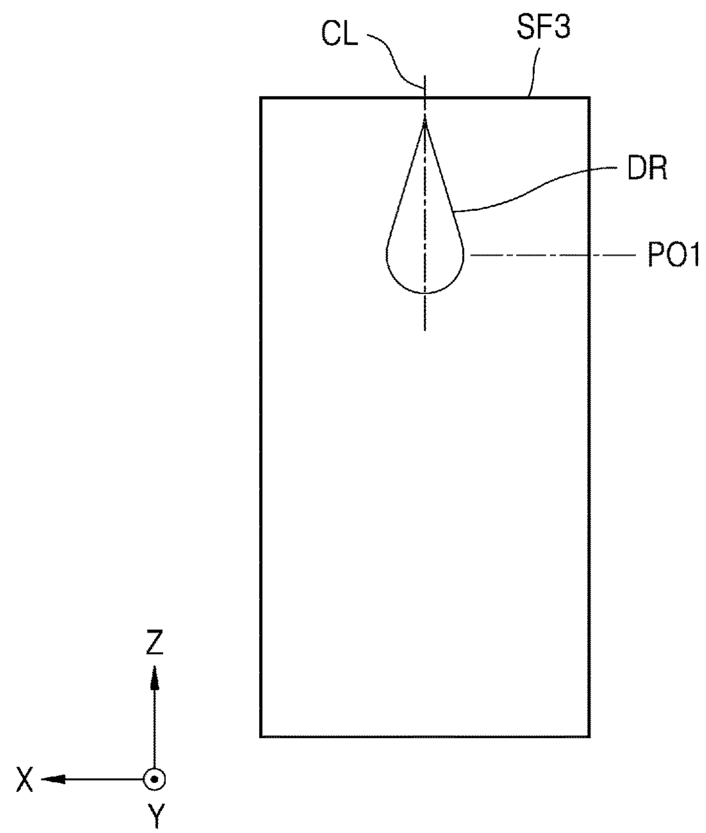
FIGS. 10A through 10C are side views of a cross-sectional shape of a liquid droplet sensed by a sensor unit shown in FIG. 9.
Figure 10B:
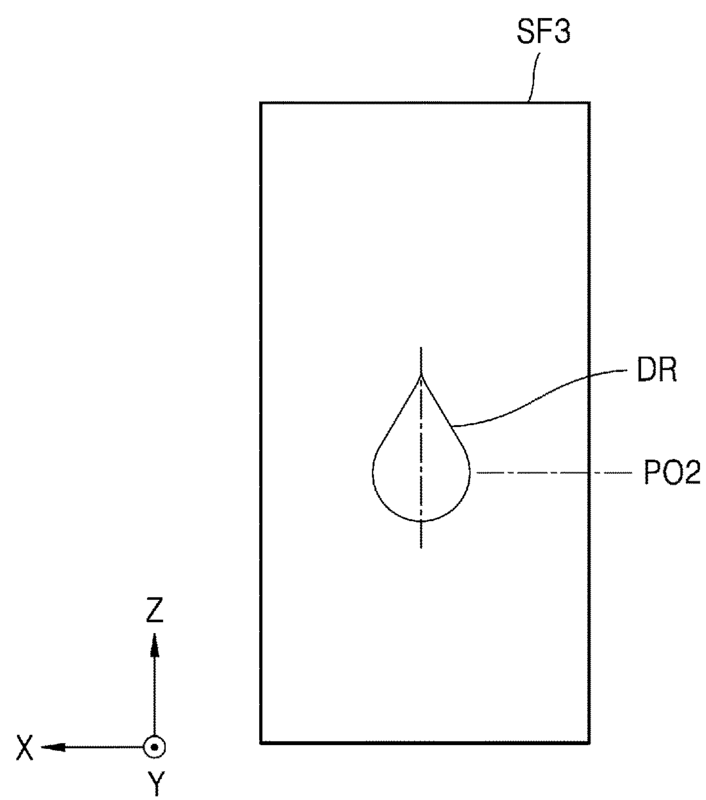
Figure 10C:
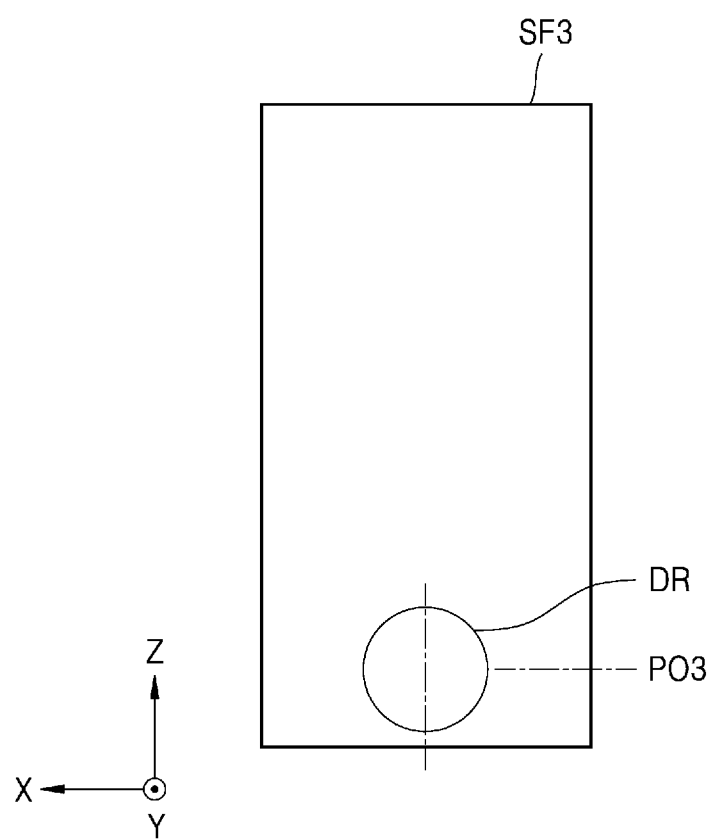

FIG. 9 is a perspective view of a portion of the apparatus for manufacturing a display device according to an embodiment. FIGS. 10A to 10C are side views of a cross-sectional shape of a liquid droplet DR sensed by a sensor unit shown in FIG. 9.

Referring to FIGS. 9 to 10C, the apparatus (not shown) for manufacturing a display device may be similar to that described with reference to FIGS. 1 and 2.

The sensor unit 150 may be a confocal microscope or an interferometric microscope. In this case, the sensor unit 150 may sense a planar shape projected on a third plane SF3 of a liquid droplet DR that falls down. For example, the sensor unit 150 may sense a cross-sectional shape of a liquid droplet DR on the third plane SF3. In this case, positions of the third plane SF3 may be the same as or similar to or parallel to each other according to a falling path of the liquid droplet DR.

As shown in FIG. 10A, the sensor unit 150 may sense the cross-sectional shape of the liquid droplet DR at each of the first position PO1, the sensor unit 150, and the third position PO3. In this case, the sensor unit 150 may sense the position of the liquid droplet DR at each position separately by operating at a certain or a predetermined time interval. In an embodiment, the sensor unit 150 may continuously sense the cross-sectional shape of the liquid droplet DR.

The controller 180 may calculate a three-dimensional shape of the liquid droplet DR at each position based on the cross-sectional shape of the liquid droplet DR sensed by the sensor unit 150. In this case, the controller 180 may assume a shape of the liquid droplet DR as a shape of a rotating body. In addition, the controller 180 may assume, as a central line CL, an arbitrary straight line parallel to a straight line that passes the cross-sectional shape of the liquid droplet DR at each position and may be substantially perpendicular to an upper surface of the display substrate S. In an embodiment, the controller 180 may assume the falling path of the liquid droplet DR as the central line CL.

The controller 180 may rotate the cross-sectional shape of the liquid droplet DR based on the central line CL as described above. The controller 180 may determine a shape of the liquid droplet DR formed by rotation as a three-dimensional shape of the liquid droplet DR.

The controller 180 may perform the operations described above at the first position PO1, the second position PO2, and the third position PO3, respectively. In addition, the controller 180 may calculate a center (not shown) of the liquid droplet DR in a case that the liquid droplet DR is at the first to third positions PO1 to PO3. In this case, because a method of calculating the center of the liquid droplet DR is the same as or similar to that described with reference to FIGS. 3A to 5B, a detailed description thereof will be omitted.

In a case that the position of the liquid droplet DR, the three-dimensional shape of the liquid droplet DR, and the center of the liquid droplet DR are determined as described above, the controller 180 may calculate at least one of the volume of the liquid droplet DR, the falling path of the liquid droplet DR, the falling speed of the liquid droplet DR, and the discharge angle of the liquid droplet DR. In this case, because a method, performed by the controller 180, of calculating at least one of the volume of the liquid droplet DR, the falling path of the liquid droplet DR, the falling speed of the liquid droplet DR, and the discharge angle of the liquid droplet DR is the same as or similar to that described above, a detailed description thereof will be omitted.

The controller 180 may control the moving speed of the liquid droplet discharge unit 140 or the display substrate S based on at least one of the volume of the liquid droplet DR, the falling path of the liquid droplet DR, the falling speed of the liquid droplet DR, and the discharge angle of the liquid droplet DR, which are calculated as described above.

As an example, in a case that it is determined that the calculated volume of the liquid droplet DR is greater than the predetermined set volume, the controller 180 may reduce an amount of liquid droplets DR that land on the display substrate S for the same period of time by reducing an amount of liquid droplets DR discharged from the liquid droplet discharge unit 140. On the other hand, in a case that it is determined that the calculated volume of the liquid droplet DR is less than the predetermined set volume, the controller 180 may increase the amount of the liquid droplets DR that land on the display substrate S for the same time by increasing the amount of the liquid droplets DR discharged from the liquid droplet discharge unit 140. In an embodiment, the controller 180 may control a time for which the liquid droplet DR is discharged from the liquid droplet discharge unit 140 by comparing the calculated volume of the liquid droplet DR with a total amount of liquid droplets DR to be supplied to one opening 19OP of a pixel-defining layer 19. In addition, in an embodiment, in a case that the liquid droplets DR are supplied to the one opening 19OP of the pixel-defining layer 19 using at least two nozzles, the controller 180 may adjust a volume of the liquid droplet DR supplied from each nozzle, supply the liquid droplet DR using only some or a predetermined number of nozzles, and control a time for which the liquid droplet DR is supplied from each nozzle, as described above.

The controller 180 may adjust the position of the liquid droplet discharge unit 140 by calculating a point at which the liquid droplet DR lands on the display substrate S after measuring the falling path of the liquid droplet DR or the discharge angle of the liquid droplet DR. In an embodiment, the controller 180 may control the moving speed of the display substrate S or the moving speed of the liquid droplet discharge unit 140 or may control the liquid droplet discharge unit 140 to be washed as described above, using the falling path of the liquid droplet DR or the discharge angle of the liquid droplet DR.

Accordingly, the apparatus for manufacturing a display device and the method of manufacturing the display device may precisely control and discharge a liquid droplet DR, thereby precisely supplying the liquid droplet DR to an accurate position on the display substrate S.

Figure 11:
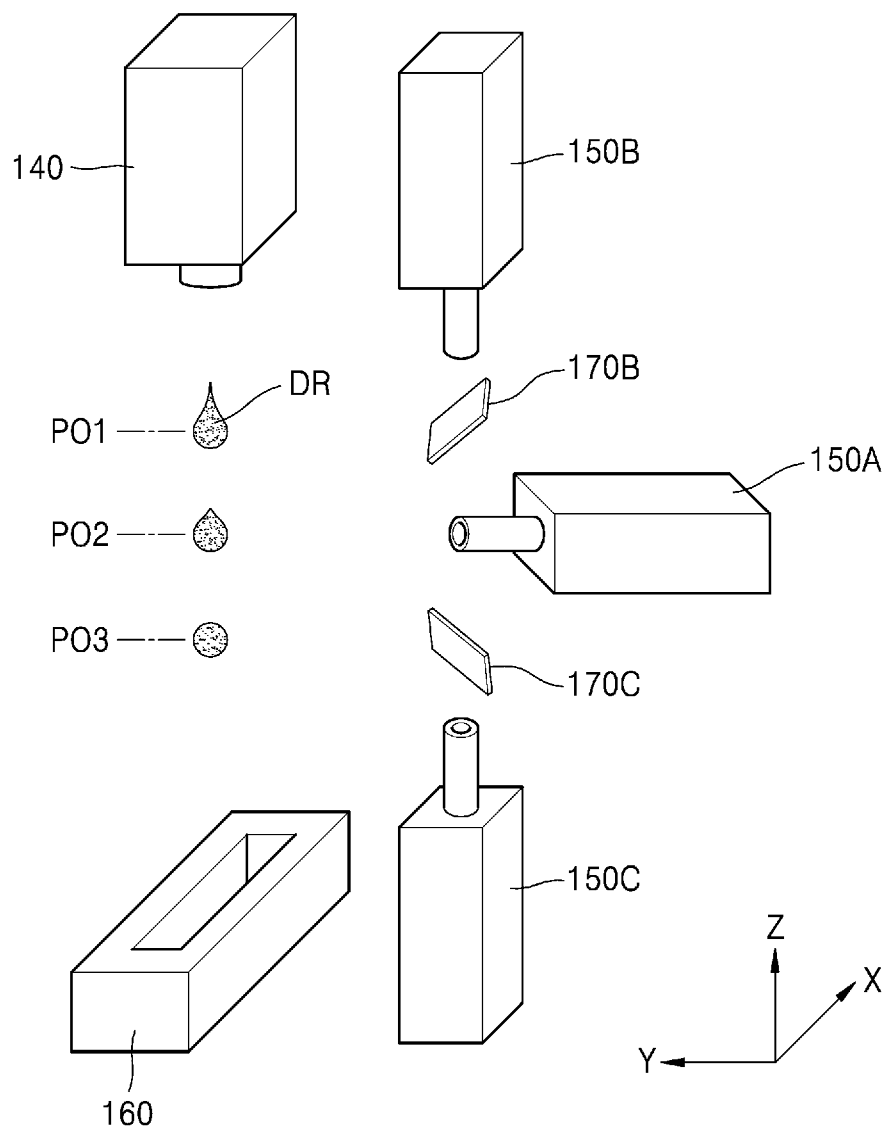
FIG. 11 is a perspective view of a portion of an apparatus for manufacturing a display device according to an embodiment.

FIG. 11 is a perspective view of a portion of the apparatus for manufacturing a display device according to an embodiment.

Referring to FIG. 11, the apparatus for manufacturing a display device may be similar to that described with reference to FIGS. 1 and 2.

Sensor units 150 may be provided. In this case, the sensor units 150 may be arranged or disposed in various directions. For example, one of the sensor units 150 may be arranged or disposed substantially perpendicular to the falling path of the liquid droplet DR. Another of the sensor units 150 may be arranged or disposed in substantially parallel with the falling path of the liquid droplet DR.

For example, the sensor units 150 may include a first sensor unit 150A at a center thereof, and a second sensor unit 150B and a third sensor unit 150C arranged or disposed to be spaced apart from the first sensor unit 150A. In this case, the second sensor unit 150B and the third sensor unit 150C may be arranged or disposed to face each other.

The apparatus for manufacturing a display device may include a second reflection unit 170B and a third reflection unit 170C arranged or disposed to correspond to the second sensor unit 150B and the third sensor unit 150C, respectively. In this case, the second reflection unit 170B and the third reflection unit 170C may reflect laser light emitted from the second sensor unit 150B and the third sensor unit 150C, respectively, and may guide laser light reflected from the liquid droplet DR to the second sensor unit 150B and the third sensor unit 150C, respectively. The second reflection unit 170B and the third reflection unit 170C may be in a mirror form.

The first sensor unit 150A, the second sensor unit 150B, and the third sensor unit 150C may sense the liquid droplet DR at different positions. For example, the first sensor unit 150A may sense a liquid droplet DR in a case that the liquid droplet DR is at the second position PO2. The second sensor unit 150B may sense a liquid droplet DR in a case that the liquid droplet DR is at the first position PO1. The third sensor unit 150C may sense a liquid droplet DR in a case that the liquid droplet DR is at the third position PO3.

The first to third sensor units 150A to 150C as described above may be one of a confocal microscope, an interferometric microscope, or a chromatic confocal line sensor. In an embodiment, at least one of the first to third sensor units 150A to 150C may be one of the confocal microscope, the interferometric microscope, or the chromatic confocal line sensor, and the others of the first to third sensor units 150A to 150C may be the others of the confocal microscope, the interferometric microscope, or the chromatic confocal line sensor. In addition, in an embodiment, the first to third sensor units 150A to 150C may be different devices among the confocal microscope, the interferometric microscope, or the chromatic confocal line sensor.

The first to third sensor units 150A to 150C as described above may sense a portion of a planar shape of a liquid droplet DR projected onto an arbitrary plane at each position or a cross-sectional shape of the liquid droplet DR. In this case, a controller (not shown) may calculate a three-dimensional shape of the liquid droplet DR at each position based on a result sensed by each sensor unit. The controller may calculate the volume of the liquid droplet DR based on the calculated three-dimensional shape. In addition, the controller may calculate at least one of the falling path of the liquid droplet DR, the falling speed of the liquid droplet DR, and the discharge angle of the liquid droplet DR based on a center of the liquid droplet DR at each position.

Accordingly, the apparatus for manufacturing a display device and the method of manufacturing the display device may precisely control and discharge a liquid droplet DR, thereby precisely supplying the liquid droplet DR to an accurate position on the display substrate S.

Figure 12:
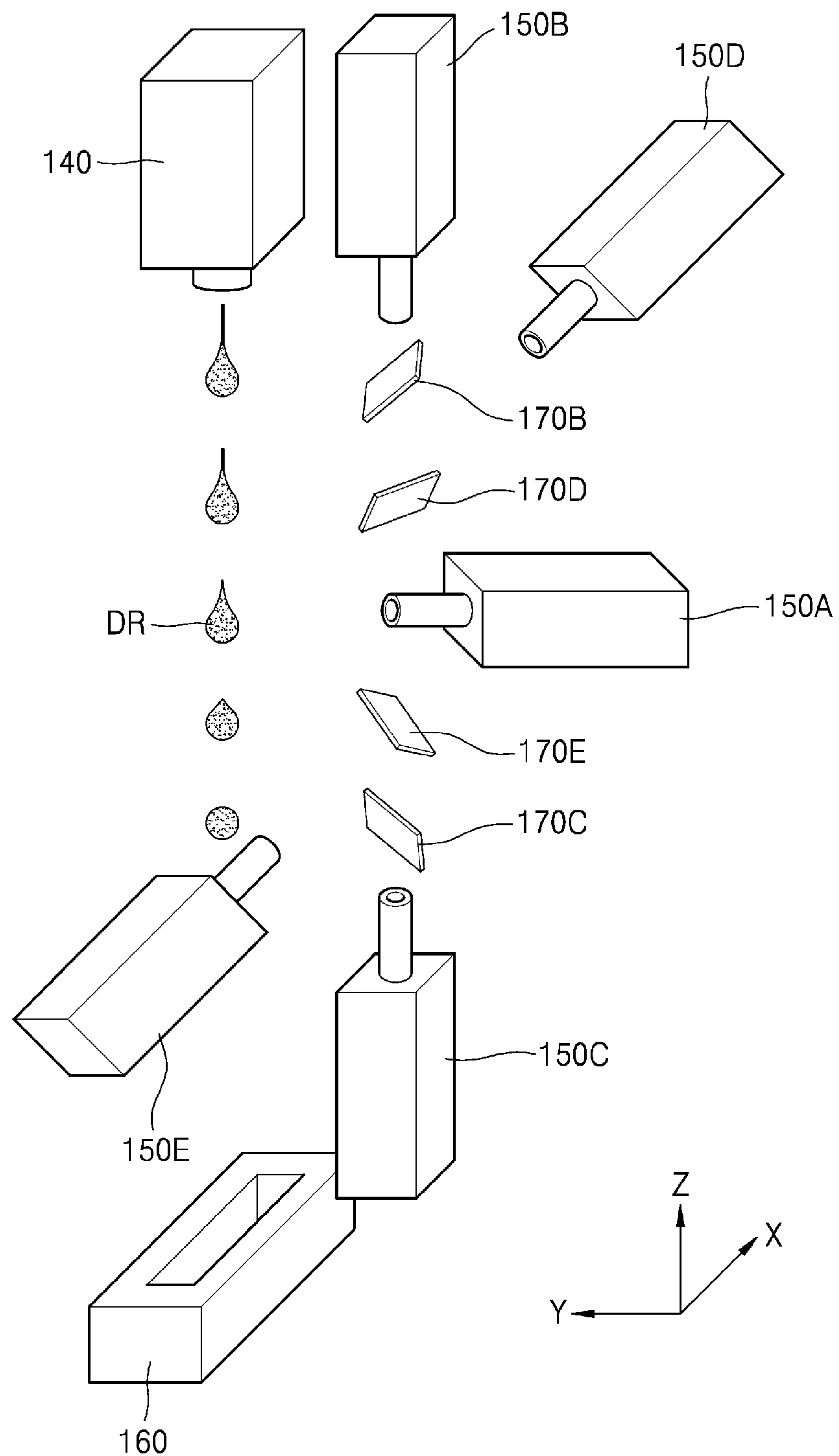
FIG. 12 is a perspective view of a portion of an apparatus for manufacturing a display device according to an embodiment.

FIG. 12 is a perspective view of a portion of the apparatus for manufacturing a display device according to an embodiment.

Referring to FIG. 12, the apparatus (not shown) for manufacturing a display device may be similar to that shown in FIG. 11.

The sensor unit 150 may include a fourth sensor unit 150D and a fifth sensor unit 150E which may be arranged or disposed to be inclined with respect to the falling path of the liquid droplet DR, in addition to the first sensor unit 150A, the second sensor unit 150B, and the third sensor unit 150C. In this case, the fourth sensor unit 150D and the fifth sensor unit 150E may be arranged or disposed to correspond to a fourth reflection unit 170D and a fifth reflection unit 170E, respectively, to irradiate laser light onto the falling path of the liquid droplet DR.

In this case, the first to fifth sensor units 150A to 150E may be arranged or disposed at different heights. For example, the first to fifth sensor units 150A to 150E may be arranged or disposed to be spaced apart from each other between the liquid droplet discharge unit 140 and the accommodation unit 160. In this case, the first to fifth sensor units 150A to 150E may sense a liquid droplet DR passing through each of spaces that are divided from a space between the liquid droplet discharge unit 140 and the accommodation unit 160.

At least one of the first to fifth sensor units 150A to 150E as described above may be at least one of the chromatic confocal line sensor, the confocal microscope, and the interferometric microscope as described above.

In this case, each of the first to fifth sensor units 150A to 150E may sense at least one of a portion of a planar shape of a liquid droplet DR projected onto an arbitrary plane at each position and a cross-sectional shape of the liquid droplet DR.

The controller 180 may calculate a volume of the liquid droplet DR at each position by calculating a three-dimensional shape of the liquid droplet DR at each position based on a result of the sensing.

In addition, the controller 180 may calculate at least one of a falling speed, a falling path, and a discharge angle of each liquid droplet DR by calculating a center of a three-dimensional shape of each liquid droplet DR.

The controller 180 may adjust the liquid droplet discharge unit 140 such that the liquid droplet DR precisely lands on a display substrate (not shown) in a case that the liquid droplet DR is supplied by the liquid droplet discharge unit 140, based on at least one of the volume of the liquid droplet DR, the falling speed of the liquid droplet DR, the falling path of the liquid droplet DR, and the discharge angle of the liquid droplet DR calculated as above.

Accordingly, the apparatus for manufacturing a display device and the method of manufacturing the display device may precisely control and discharge a liquid droplet DR, thereby precisely supplying the liquid droplet DR to an accurate position on the display substrate S.

Figure 13:
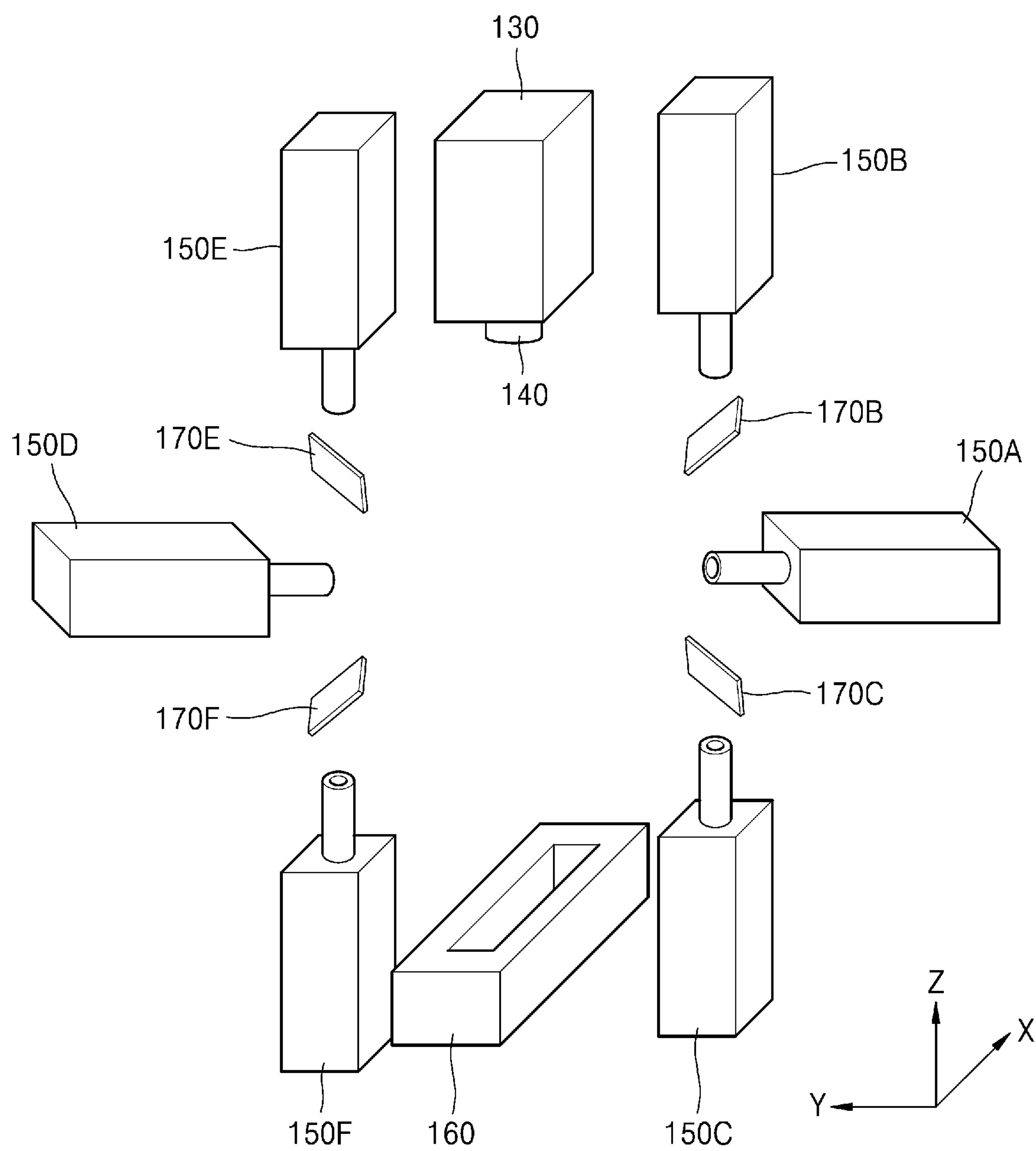
FIG. 13 is a perspective view of a portion of an apparatus for manufacturing a display device according to an embodiment.

FIG. 13 is a perspective view of a portion of the apparatus for manufacturing a display device according to an embodiment.

Referring to FIG. 13, the apparatus (not shown) for manufacturing a display device may be similar to that described with reference to FIG. 12.

In this case, sensor units 150 may be provided, and the sensor units 150 may include a first sensor unit 150A, a second sensor unit 150B, a third sensor unit 150C, a fourth sensor unit 150D, a fifth sensor unit 150E, and a sixth sensor unit 150F. In this case, the first to third sensor units 150A to 150C may be arranged or disposed in the same or similar manner as described with reference to FIG. 10. The fourth sensor unit 150D may be arranged or disposed to face the first sensor unit 150A, the fifth sensor unit 150E may be arranged or disposed opposite to the second sensor unit 150B, and the sixth sensor unit 150F may be arranged or disposed opposite to the third sensor unit 150C. In this case, the first sensor unit 150A and the fourth sensor unit 150D may sense liquid droplets DR passing through the same or similar area. In addition, the second sensor unit 150B and the fifth sensor unit 150E may sense liquid droplets DR passing through the same or similar area, and the third sensor unit 150C and the sixth sensor unit 150F may sense liquid droplets DR passing through the same or similar area. In this case, an area sensed by the first sensor unit 150A and the fourth sensor unit 150D, an area sensed by the second sensor unit 150B and the first sensor unit 150A, and an area sensed by the third sensor unit 150C and the sixth sensor unit 150F may be different from each other and may be continuously provided from each other or spaced apart from each other.

In a case where the first to sixth sensor units 150A to 150F may be arranged or disposed as described above, a fifth reflection unit 170E and a sixth reflection unit 170F may be arranged or disposed to correspond to the fifth sensor unit 150E and the sixth sensor unit 150F. In this case, the fifth reflection unit 170E and the sixth reflection unit 170F may guide laser light emitted from the fifth sensor unit 150E and the sixth sensor unit 150F, respectively, onto the falling path of the liquid droplet DR.

In this case, sensor units that sense liquid droplets DR in the same or similar area may have the same or similar or different forms. As an example, in a case that the sensor units are different from one another, one of the first sensor unit 150A and the fourth sensor unit 150D may be a chromatic confocal line sensor, and the other of the first sensor unit 150A and the fourth sensor unit 150D may be a confocal microscope or an interference microscope. One of the second sensor unit 150B and the fifth sensor unit 150E may be a chromatic confocal line sensor, and the other of the second sensor unit 150B and the fifth sensor unit 150E may be a confocal microscope or an interference microscope. In addition, one of the third sensor unit 150C and the sixth sensor unit 150F may be a chromatic confocal line sensor, and the other of the third sensor unit 150C and the sixth sensor unit 150F may be a confocal microscope or an interference microscope.

In this case, results sensed by the respective sensor units may be transmitted to the controller 180. The controller 180 may calculate the three-dimensional shape of the liquid droplet DR in each area based on the results sensed by the respective sensor units. In this case, the controller 180 may calculate the three-dimensional shape of the liquid droplet DR by combining results sensed by sensor units that may be arranged or disposed to face each other and sense liquid droplets DR passing through the same or similar area. For example, the controller 180 may calculate the three-dimensional shape of the liquid droplet DR by averaging three-dimensional shapes of liquid droplets DR calculated by being sensed from one area.

The controller 180 may calculate at least one of the three-dimensional shape of the liquid droplet DR, the volume of the liquid droplet DR, the falling path of the liquid droplet DR, and the discharge angle of the liquid droplet DR based on a result of sensing liquid droplets DR passing through each area as described above.

The controller 180 may control the liquid droplet discharge unit 140 based on the result as described above.

Accordingly, the apparatus for manufacturing a display device and the method of manufacturing the display device may precisely control and discharge a liquid droplet DR, thereby precisely supplying the liquid droplet DR to an accurate position on the display substrate S.

Figure 14:
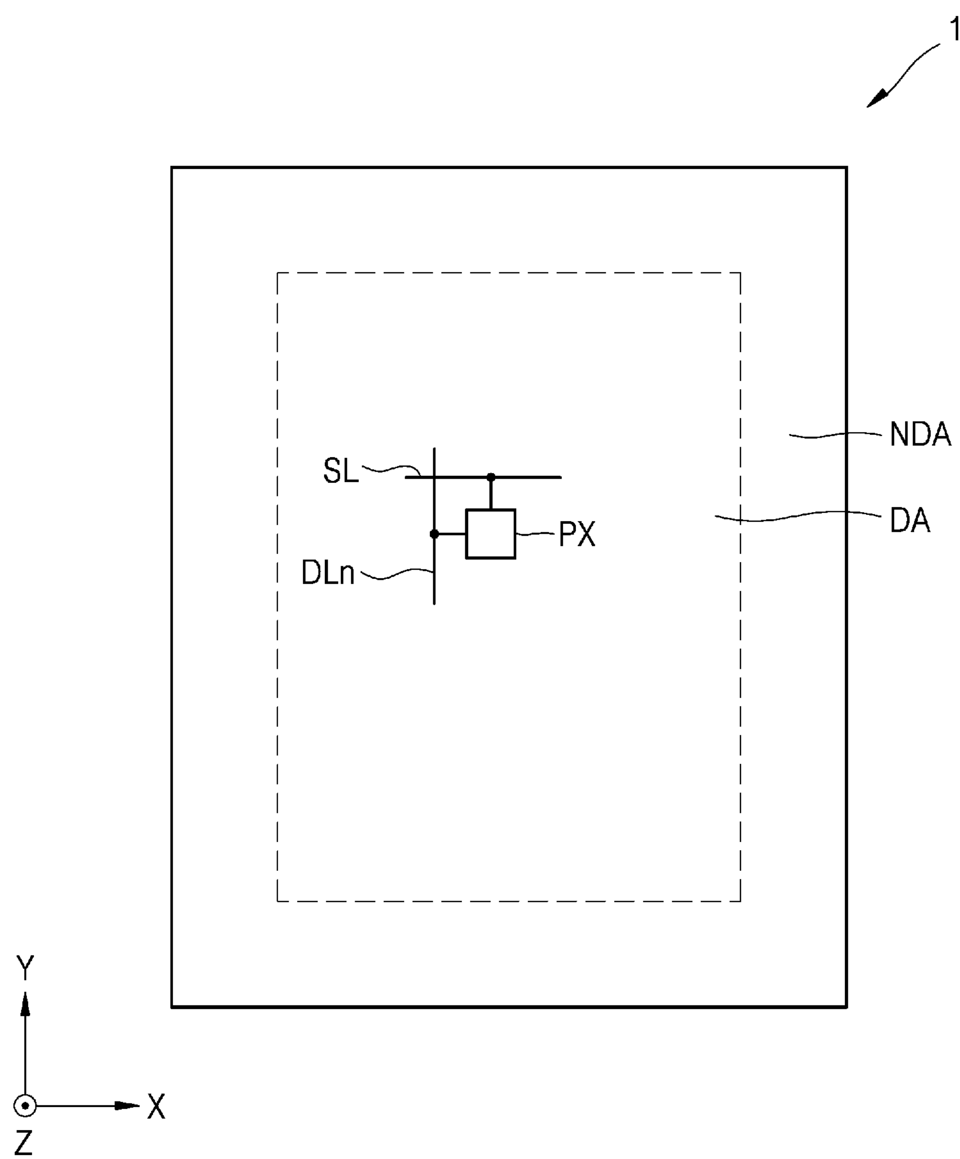
FIG. 14 is a plan view of a display device manufactured by an apparatus for manufacturing the display device according to one or more embodiments.
Figure 15:
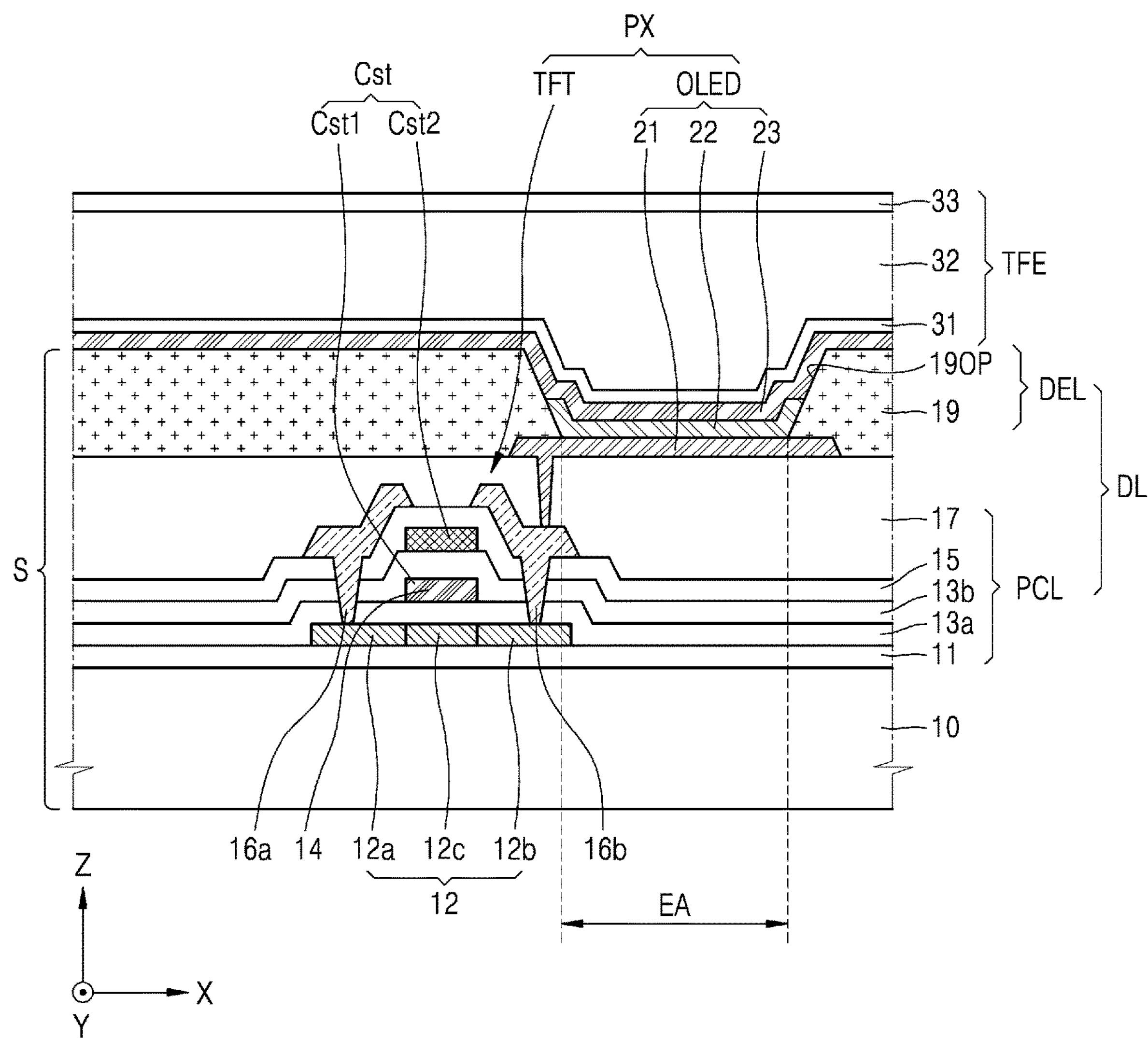
FIG. 15 is a schematic cross-sectional view of the display device shown in FIG. 14.

FIG. 14 is a plan view of a display device 1 manufactured by the apparatus for manufacturing the display device according to one or more embodiments. FIG. 15 is a schematic cross-sectional view of the display device shown in FIG. 14.

Referring to FIG. 14, the display device 1 may include a display area DA and a non-display area NDA that may surround or may be adjacent to the display area DA. The display area DA may include at least a pixel PX and a data line DLn and a scan line SL electrically connected to the pixel PX. Referring to FIGS. 14 and 15, the display device 1 may include a display substrate S. The display substrate S may include a substrate 10 and layers of a display layer DL, except for an intermediate layer and a common electrode 23.

The display layer DL and a thin-film encapsulation layer TFE may be arranged or disposed on the substrate 10. The display layer DL may include a pixel circuit layer PCL and a display element layer DEL.

The substrate 10 may include glass or a polymer resin such as polyethersulfone, polyarylate, polyetherimide, polyethylene naphthalate, polyethylene terephthalate, polyphenylene sulfide, polyimide, polycarbonate, cellulose triacetate, cellulose acetate propionate, for example.

A barrier layer (not shown) may be included between the display layer DL and the substrate 10. The barrier layer, which is a barrier layer that prevents the penetration of external foreign substances, may be a single layer or a multilayer including inorganic materials such as silicon nitride ($SiN_x$, x>0) and silicon oxide ($SiO_x$, x>0).

The pixel circuit layer PCL may be arranged or disposed on the substrate 10. In FIG. 15, it is shown that the pixel circuit layer PCL may include a buffer layer 11, a first gate insulating layer 13*a*, a second gate insulating layer 13*b*, an interlayer insulating layer 15, and a planarization insulating layer 17 arranged or disposed below and/or above a thin-film transistor TFT and elements of the thin-film transistor TFT.

The buffer layer 11 may include an inorganic insulating material such as silicon nitride, silicon oxynitride, and silicon oxide, and may be a single layer or a multilayer including the aforementioned inorganic insulating material.

The thin-film transistor TFT may include a semiconductor layer 12, and the semiconductor layer 12 may include polysilicon. Alternatively, the semiconductor layer 12 may include amorphous silicon, an oxide semiconductor, an organic semiconductor, for example. The semiconductor layer 12 may include a channel area 12*c* and a drain area 12*a* and a source area 12*b* arranged or disposed on both sides of the channel area 12*c*, respectively. A gate electrode 14 may overlap the channel area 12*c*.

The gate electrode 14 may include a low-resistance metal material. The gate electrode 14 may include a conductive material including molybdenum (Mo), aluminum (Al), copper (Cu), titanium (Ti), for example, and may be formed of a multilayer or a single layer including the material described above.

The first gate insulating layer 13*a* between the semiconductor layer 12 and the gate electrode 14 may include silicon oxide ($SiO_2$), silicon nitride ($SiN_x$), silicon oxynitride (SiON), aluminum oxide ($Al_2O_3$), and titanium oxide ($TiO_2$), tantalum oxide ($Ta_2O_5$), hafnium oxide ($HfO_2$), zinc oxide ($ZnO_2$), or the like within the spirit and the scope of the disclosure.

The second gate insulating layer 13*b* may be provided or disposed to cover or overlap the gate electrode 14. Similar to the first gate insulating layer 13*a*, the second gate insulating layer 13*b* between the semiconductor layer 12 and the gate electrode 14 may include $SiO_2$, $SiN_x$, SiON, $Al_2O_3$, and $TiO_2$, $Ta_2O_5$, $HfO_2$, $ZnO_2$, or the like within the spirit and the scope of the disclosure.

An upper electrode Cst2 of a storage capacitor Cst may be arranged or disposed on the second gate insulating layer 13*b*. The upper electrode Cst2 may overlap the gate electrode 14 therebelow. In this case, the gate electrode 14 and the upper electrode Cst2 overlapping with the second gate insulating layer 13*b* therebetween may form the storage capacitor Cst. For example, the gate electrode 14 may function as a lower electrode Cst1 of the storage capacitor Cst.

Likewise, the storage capacitor Cst and the thin-film transistor TFT may be formed or disposed to overlap each other. In an embodiment, the storage capacitor Cst may be formed or disposed not to overlap the thin-film transistor TFT.

The upper electrode Cst2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or a multilayer of the aforementioned material.

The interlayer insulating layer 15 may cover or overlap the upper electrode Cst2. The interlayer insulating layer 15 may include $SiO_2$, $SiN_x$, SiON, $Al_2O_3$, and $TiO_2$, $Ta_2O_5$, $HfO_2$, $ZnO_2$, or the like within the spirit and the scope of the disclosure. The interlayer insulating layer 15 may be a single layer or a multilayer including the aforementioned inorganic insulating material.

A drain electrode 16*a* and a source electrode 16*b* may be located or disposed on the interlayer insulating layer 15, respectively. The drain electrode 16*a* and the source electrode 16*b* may include a material having good conductivity. The drain electrode 16*a* and the source electrode 16*b* may include a conductive material including Mo, Al, Cu, Ti, for example, and may be formed of a multilayer or a single layer including the material described above. In an embodiment, the drain electrode 16*a* and the source electrode 16*b* may have a multilayered structure of Ti/Al/Ti.

The planarization insulating layer 17 may include an organic insulating layer. The planarization insulating layer 17 may include an organic insulating material, such as a commercial polymer such as polymethyl methacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The display element layer DEL may be arranged or disposed on the pixel circuit layer PCL having the aforementioned structure. The display element layer DEL may include an organic light-emitting diode OLED, and a pixel electrode 21 of the organic light-emitting diode OLED may be electrically connected to the thin-film transistor TFT through a contact hole of the planarization insulating layer 17.

A pixel PX may include the organic light-emitting diode OLED and the thin-film transistor TFT. Each pixel PX may emit, for example, red, green, or blue light or red, green, blue, or white light through the organic light-emitting diode OLED.

The pixel electrode 21 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 21 may include a reflective layer including Ag, Mg, Al, Pt, Pd, Au, Ni, Nd, Ir, Cr, or a compound thereof. In an embodiment, the pixel electrode 21 may include a layer including ITO, IZO, ZnO, or $In_2O_3$ above or below the aforementioned reflective layer.

A pixel-defining layer 19 having an opening 19OP that may expose a central portion of the pixel electrode 21 may be arranged or disposed on the pixel electrode 21. The pixel-defining layer 19 may include an organic insulating material and/or an inorganic insulating material. The opening 19OP may define a light-emitting area (hereinafter, referred to as a light-emitting area EA) of light emitted from the organic light-emitting diode OLED. For example, a width of the opening 19OP may correspond to a width of the light-emitting area EA.

A light-emitting layer 22 may be arranged or disposed in the opening 19OP of the pixel-defining layer 19. The light-emitting layer 22 may include a polymer or low molecular organic material that emits light of a predetermined color. In an embodiment, the light-emitting layer 22 may include a quantum dot material. The light-emitting layer 22 may be formed by discharging liquid droplets using the apparatus for manufacturing a display device according to an embodiment of the disclosure.

Although not shown, a first functional layer and a second functional layer may be arranged or disposed below and on the light-emitting layer 22, respectively. For example, the first functional layer may include a hole transport layer (HTL) or may include an HTL and a hole injection layer (HIL). The second functional layer, which is an element arranged or disposed on the light-emitting layer 22, is optional. The second functional layer may include an electron transport layer (ETL) and/or an electron injection layer (EIL). The first functional layer and/or the second functional layer may be a common layer formed or disposed to entirely cover or overlap the substrate 10 in the same or a similar manner as a common electrode 23 to be described later.

The common electrode 23 may be formed of a conductive material having a low work function. For example, the common electrode 23 may include a (semi) transparent layer including Ag, Mg, Al, Pt, Pd, Au, Ni, Nd, Ir, Cr, lithium (Li), Ca, or an alloy thereof. Alternatively, the common electrode 23 may include a layer such as ITO, IZO, ZnO, or $In_2O_3$ on the (semi) transparent layer including the aforementioned material.

In an embodiment, the thin-film encapsulation layer TFE may include at least one inorganic encapsulation layer and at least one organic encapsulation layer. In an embodiment, in FIG. 15, it is shown that the thin-film encapsulation layer TFE may include a first inorganic encapsulation layer 31, an organic encapsulation layer 32, and a second inorganic encapsulation layer 33 that are sequentially stacked.

Each of the first inorganic encapsulation layer 31 and the second inorganic encapsulation layer 33 may include one or more inorganic materials, such as aluminum oxide, titanium oxide, tantalum oxide, hafnium oxide, zinc oxide, silicon oxide, silicon nitride, and silicon oxynitride. The organic encapsulation layer 32 may include a polymer-based material. Examples of the polymer-based material may include acryl-based resin, epoxy-based resin, polyimide, polyethylene, for example, within the spirit and the scope of the disclosure. In an embodiment, the organic encapsulation layer 32 may include acrylate.

In an embodiment, the thin-film encapsulation layer TFE may have a structure in which the substrate 10 and an upper substrate, which is a transparent member, are coupled to each other by a sealing member to seal an inner space between the substrate 10 and the upper substrate. In this case, a moisture absorbent or a filler may be located or disposed in the inner space. The sealing member may be a sealant, and in an embodiment, the sealing member may be formed of a material being cured by laser. For example, the sealing member may be a frit. As an example, the sealing member may be formed of an organic sealant such as urethane-based resin, epoxy-based resin, and acryl-based resin, or an inorganic sealant such as silicon. As the urethane-based resin, for example, urethane acrylate or the like may be used. As the acryl-based resin, for example, butyl acrylate, ethyl hexyl acrylate, or the like may be used. The sealing member may be formed of a material being cured by heat.

A touch electrode layer (not shown) including touch electrodes may be arranged or disposed on the thin-film encapsulation layer TFE, and an optical functional layer (not shown) may be arranged or disposed on the touch electrode layer. The touch electrode layer may obtain, coordinate information according to an external input, for example, a touch event. The optical functional layer may reduce reflectivity of light (external light) incident from the outside toward the display device 1 and/or improve color purity of light emitted from the display device 1. In an embodiment, the optical functional layer may include a phase retarder and a polarizer. The phase retarder may be of a film type or a liquid crystal coating type, and may include a λ/2 phase retarder and/or a λ/4 phase retarder. The polarizer may also be of a film type or a liquid crystal coating type. The film type may include a stretchable synthetic resin film, and the liquid crystal coating type may include liquid crystals arranged or disposed in a predetermined arrangement. Each of the phase retarder and the polarizer may include a protective film.

In an embodiment, the optical functional layer may include a black matrix and color filters. The color filters may be arranged or disposed in consideration of a color of light emitted from each of the pixels PX of the display device 1. Each of the color filters may include a red, green, or blue pigment or dye. Alternatively, each of the color filters may include quantum dots, in addition to the aforementioned pigment or dye. Alternatively, some or a predetermined number of the color filters may not include the aforementioned pigment or dye, and may include scattering particles such as titanium oxide. The color filters as described above may be formed by discharging liquid droplets using the apparatus for manufacturing a display device according to an embodiment of the disclosure.

In an embodiment, the optical functional layer may include a destructive interference structure. The destructive interference structure may include a first reflection layer and a second reflection layer arranged or disposed on different layers. A first reflected light and a second reflected light respectively reflected from the first reflection layer and the second reflection layer may destructively interfere with each other, and accordingly, external light reflectivity may be reduced.

An adhesive member may be arranged or disposed between the touch electrode layer and the optical functional layer. General adhesives known in the art may be used as the adhesive member without any limitation. The adhesive member may be a pressure sensitive adhesive (PSA).

As described above, the disclosure has been described with reference to embodiments shown in the figures, but the embodiments are merely examples. It will be understood by one of ordinary skill in the art that various modifications to the embodiments may be made therein. Therefore, the technical scope of the disclosure should be defined by the technical spirit of the appended claims.

The apparatus for manufacturing a display device and the method of manufacturing the display device according to one or more embodiments may manufacture a display device capable of implementing precise images.

The apparatus for manufacturing a display device and the method for manufacturing the display device according to one or more embodiments may accurately and precisely measure liquid droplets in real time.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:

discharging a droplet;

irradiating laser light onto a plane of an outer shape of the droplet;

sensing, during a time period while the droplet is falling, at least one of a partial shape of an outer surface of the droplet and a cross-sectional shape of the droplet projected onto the plane on a falling path of the droplet by reflected laser light reflected from the plane; and calculating one or more parameters of the droplet, the one or more parameters including at least one of a volume of the droplet, a falling speed of the droplet, a falling path of the droplet, and a discharge angle of the droplet, based on at least one of the partial shape of the outer surface of the droplet and the cross-sectional shape of the droplet;

adjusting the discharging of the droplet based on the calculating of the one or more parameters of the droplet; and manufacturing the display device using the droplet based on the calculated one or more parameters of the droplet.

2. The method of claim 1, further comprising:

calculating a three-dimensional shape of the droplet based on at least one of the partial shape of the outer surface of the droplet and the cross-sectional shape of the droplet.

3. The method of claim 2, further comprising:

calculating the three-dimensional shape of the droplet at a predetermined time interval.

4. The method of claim 3, further comprising:

calculating at least one of the discharge angle of the droplet and the falling path of the droplet by connecting centers of the three-dimensional shape of the droplet.

5. The method of claim 1, further comprising:

sensing the partial shape of the outer surface of the droplet on a plane perpendicular to the falling path of the droplet; and calculating the cross-sectional shape of the droplet on the plane perpendicular to the falling path, based on the partial shape of the outer surface of the droplet.

6. The method of claim 5, further comprising:

sensing, at a predetermined time interval, the partial shape of the outer surface of the droplet on the plane perpendicular to the falling path of the droplet.

7. The method of claim 6, further comprising:

calculating a three-dimensional shape of the droplet based on the cross-sectional shape of the droplet calculated at the predetermined time interval.

8. The method of claim 1, further comprising:

sensing the cross-sectional shape of the droplet projected onto a plane including the falling path of the droplet; and calculating a three-dimensional shape of the droplet by rotating the cross-sectional shape of the droplet with respect to the falling path of the droplet.

9. The method of claim 1, further comprising:

sensing the partial shape of the outer surface of the droplet on a plane including the falling path of the droplet; and calculating the cross-sectional shape of the droplet on the plane including the falling path based on the partial shape of the outer surface of the droplet.

10. The method of claim 9, further comprising:

calculating a three-dimensional shape of the droplet by rotating the cross-sectional shape of the droplet with respect to the falling path of the droplet.

11. A method of manufacturing a display device, the method comprising:

discharging a droplet;

irradiating laser light onto a plane of an outer shape of the droplet;

sensing, during a time period while the droplet is falling, at least one of a partial shape of an outer surface of the droplet and a cross-sectional shape of the droplet projected onto the plane on a falling path of the droplet by reflected laser light reflected from the plane;

based at least one of the sensed partial shape of an outer surface of the droplet and sensed cross-sectional shape of the droplet projected, calculating at least one of a volume of the droplet, a falling speed of the droplet, a falling path of the droplet, and a discharge angle of the droplet, based on at least one of the partial shape of the outer surface of the droplet and the cross-sectional shape of the droplet; and adjusting the discharging of the droplet based on at least one of a discharge amount and a discharge speed of the droplet based on at least one of the volume of the droplet, the falling speed of the droplet, the falling path of the droplet, and the discharge angle of the droplet.

* * * * *